(12) United States Patent
Wang et al.

(10) Patent No.: US 11,424,610 B2
(45) Date of Patent: Aug. 23, 2022

(54) APPARATUS, POWER SUPPLY, METHOD AND RECORDING MEDIUM TO DETERMINE A STATE OF A THREE-PHASE AC POWER SUPPLY USING INSTANTANEOUS VOLTAGES OF THREE PHASES OF THE AC VOLTAGE

(71) Applicant: FUJI ELECTRIC CO., LTD., Kanagawa (JP)

(72) Inventors: Qichen Wang, Hino (JP); Nobuyuki Tawada, Yokkaichi (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 401 days.

(21) Appl. No.: 16/589,102

(22) Filed: Sep. 30, 2019

(65) Prior Publication Data

US 2020/0161851 A1 May 21, 2020

(30) Foreign Application Priority Data

Nov. 21, 2018 (JP) .............................. JP2018-218384

(51) Int. Cl.
*H02H 3/34* (2006.01)
*G01R 31/42* (2006.01)
*H02M 1/14* (2006.01)
*H02H 3/253* (2006.01)

(52) U.S. Cl.
CPC ............... *H02H 3/34* (2013.01); *G01R 31/42* (2013.01); *H02H 3/253* (2013.01); *H02M 1/14* (2013.01)

(58) Field of Classification Search
CPC .................................................. H02M 7/02–42
See application file for complete search history.

(56) References Cited

U.S. PATENT DOCUMENTS

| 2013/0253716 A1* | 9/2013 | Gross ........................ G06F 1/26 |
| | | 700/287 |
| 2018/0261417 A1* | 9/2018 | Woo .................... H01H 71/2409 |

FOREIGN PATENT DOCUMENTS

| DE | 102019000868 B4 * | 4/2021 | ............. H01H 11/04 |
| JP | H06165364 A | 6/1994 | |
| WO | WO-2005119878 A1 * | 12/2005 | ................ H02J 9/06 |
| WO | WO-2020060457 A1 * | 3/2020 | ............. H04B 15/02 |

* cited by examiner

*Primary Examiner* — Peter M Novak

(57) ABSTRACT

A conventional technique makes a configuration complicated. Provided is an apparatus including: a voltage measuring unit configured to measure each of instantaneous voltages of three-phase AC voltage; and a determination unit configured to determine a state of a power supply source of the three-phase AC voltage based on a result of comparison between a comparison target value corresponding to a sum of n-th powers (n is a positive even number) of the instantaneous voltages of the three-phase AC voltage and a reference value.

12 Claims, 10 Drawing Sheets

APPARATUS, POWER SUPPLY, METHOD AND RECORDING MEDIUM TO DETERMINE A STATE OF A THREE-PHASE AC POWER SUPPLY USING INSTANTANEOUS VOLTAGES OF THREE PHASES OF THE AC VOLTAGE

The contents of the following Japanese patent application is incorporated herein by reference:
2018-218384 filed in JP on Nov. 21, 2018

BACKGROUND

1. Technical Field

The present invention relates to an apparatus, a power supply, a method, and a recording medium including three phase or polyphase rectifiers with multiple power supplies.

2. Related Art

There has been conventionally proposed a technique that detects a ripple of the sum of squares of instantaneous voltages of three-phase AC voltage to detect a phase interruption of a power supply (e.g., refer to Patent Document 1). This technique detects the ripple using a differentiating circuit including a capacitor and a resistor.
Patent Document 1: Japanese Patent Application Publication No. Hei. 6-165364

However, the conventional technique makes a configuration to determine an abnormal state complicated.

SUMMARY

In order to solve the above problem, in a first embodiment of the present invention, an apparatus is provided. The apparatus may include a voltage measuring unit configured to measure each of instantaneous voltages of three-phase AC voltage. The apparatus may include a determination unit configured to determine a state of a power supply source of the three-phase AC voltage based on a result of comparison between a comparison target value corresponding to a sum of n-th powers (n is a positive even number) of the instantaneous voltages of the three-phase AC voltage and a reference value.

The determination unit may include a first determination unit configured to determine that the power supply source is in an abnormal state in response to the comparison target value intermittently falling below a first reference value for a first reference time. The determination unit may include a second determination unit configured to determine that the power supply source is in an abnormal state in response to the comparison target value falling below a second reference value smaller than the first reference value.

The first determination unit may sequentially shift a time window having a time duration of the first reference time and determine that the power supply source is in an abnormal state in response to the comparison target value intermittently falling below the first reference value at each of a plurality of time points within the time window.

The first determination unit, after determining that the power supply source is in a normal state, may not determine that the power supply source has become an abnormal state in a case that the time window includes a period during which the comparison target value is continuously equal to or higher than the first reference value for a second reference time that is shorter than the first reference time.

The first determination unit may determine that the power supply source is abnormal in response to the comparison target value falling below the first reference value a larger number of times than a reference number within the first reference time.

The determination unit may calculate the comparison target value at a period equal to an integral submultiple of a period of the three-phase AC voltage to perform determination.

In a second embodiment of the present invention, a power supply is provided. The power supply may include the apparatus according to the first embodiment. The power supply may include a switching unit configured to switch a to-be-used power supply source between a first power supply source of the three-phase AC voltage and a second power supply source of the three-phase AC voltage based on a determination result of the determination unit of the apparatus.

The determination unit may determine a state of the first power supply source. The switching unit may switch the to-be-used power supply source to the first power supply source in a case that the determination unit determines that the first power supply source is in a normal state. The switching unit may switch the to-be-used power supply source to the second power supply source in a case that the determination unit determines that the first power supply source is in an abnormal state.

The determination unit, after determining that the first power supply source is in an abnormal state, may determine that the first power supply source has become a normal state in response to the comparison target value for the first power supply source being continuously equal to or higher than the first reference value for the first reference time.

The determination unit may set the first reference value to be higher for determining that the first power supply source has become a normal state from an abnormal state than for determining that the first power supply source has become an abnormal state from a normal state.

The switching unit may switch the to-be-used power supply source to the second power supply source regardless of the determination result of the determination unit in response to a switching frequency exceeding a reference frequency.

The power supply may include a positive side capacitor and a negative side capacitor connected in order between a positive side output terminal and a negative side output terminal. The power supply may include a positive side semiconductor switch and a negative side semiconductor switch for each phase of the three-phase AC voltage, the positive side semiconductor switch and the negative side semiconductor switch being connected in order in parallel to the positive side capacitor and the negative side capacitor between the positive side output terminal and the negative side output terminal. The power supply may include a plurality of rectifier circuits, each including an AC input terminal and being configured to rectify current flowing between the AC input terminal and the positive side output terminal and between the AC input terminal and the negative side output terminal. Each of the rectifier circuits may be provided for each phase of the three-phase AC voltage and each of the first power supply source and the second power supply source. Each of the rectifier circuits may include a positive side rectifier connected between the AC input terminal and the positive side output terminal, capable of controlling a conduction state in a forward direction from the AC input terminal to the positive side output terminal, and configured to interrupt current in a reverse direction.

Each of the rectifier circuits may include a negative side rectifier connected between the AC input terminal and the negative side output terminal, capable of controlling a conduction state in a forward direction from the negative side output terminal to the AC input terminal, and configured to interrupt current in a reverse direction.

The positive side rectifier and the negative side rectifier of each of the rectifier circuits may be thyristors.

In a third embodiment of the present invention, a method is provided. The method may include measuring each of instantaneous voltages of three-phase AC voltage. The method may include determining a state of a power supply source of the three-phase AC voltage based on a result of comparison between a comparison target value corresponding to a sum of n-th powers (n is a positive even number) of the instantaneous voltages of the three-phase AC voltage and a reference value.

In a fourth embodiment of the present invention, a recording medium having recorded thereon a program is provided. The program may cause a computer to measure each of instantaneous voltages of three-phase AC voltage. The program may cause the computer to determine a state of a power supply source of the three-phase AC voltage based on a result of comparison between a comparison target value corresponding to a sum of n-th powers (n is a positive even number) of the instantaneous voltages of the three-phase AC voltage and a reference value.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by embodiments of the invention.

[1. Configuration of Power Supply 1]

Figure 1:
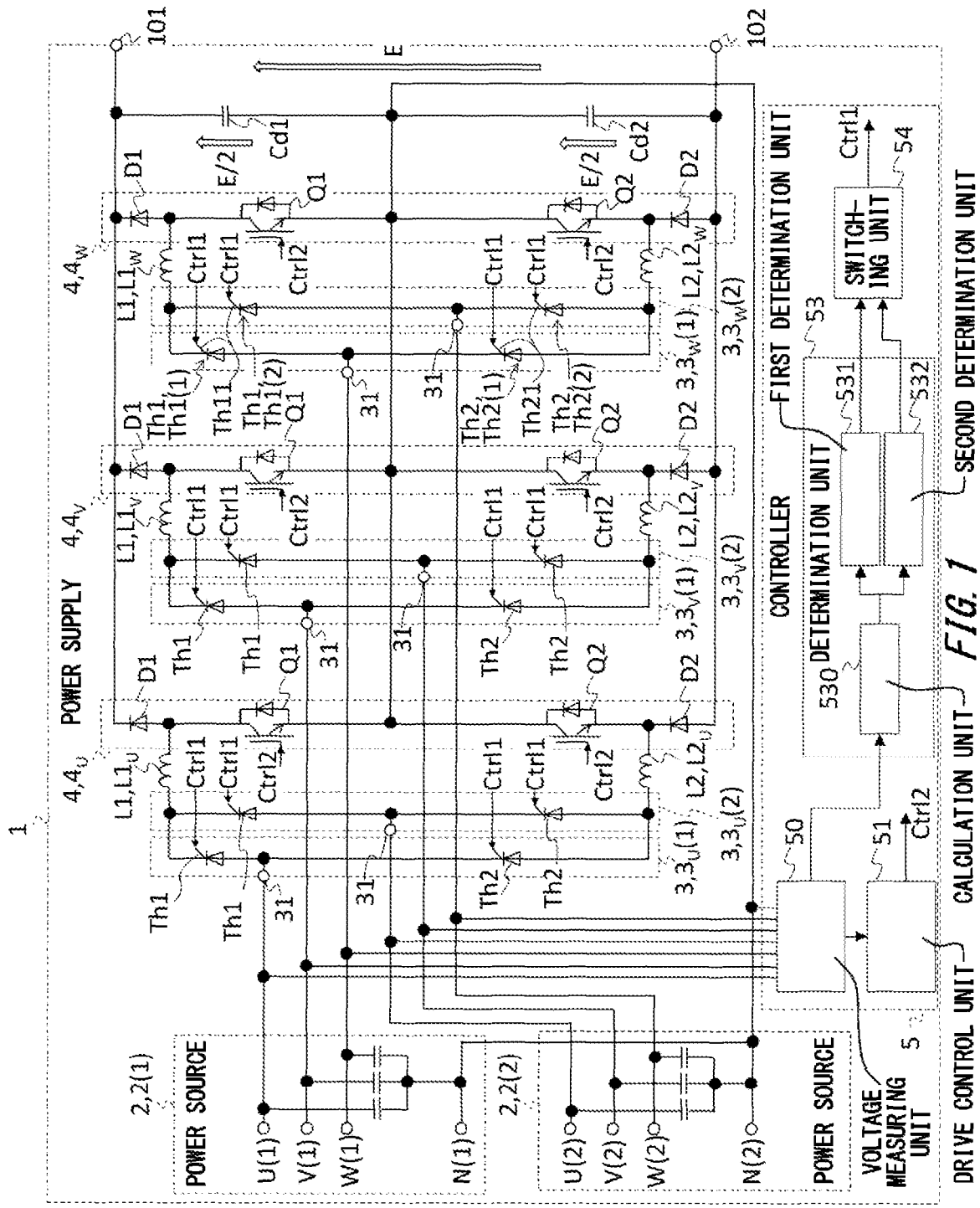
FIG. 1 illustrates a power supply 1 according to the present embodiment.

FIG. 1 illustrates a power supply 1 according to the present embodiment. Note that open arrow symbols in the figure indicate the positive direction of voltage.

The power supply 1 converts AC power supplied from either of two power sources 2 into DC power and outputs the DC power from a positive side output terminal 101 and a negative side output terminal 102. The power supply 1 may be a DC uninterruptible power supply which maintains supply of DC power by switching the power source 2 to be used. The power supply 1 includes the two power sources 2, a plurality of rectifier circuits 3, a positive side capacitor Cd1 and a negative side capacitor Cd2, a plurality of switching circuits 4, a plurality of positive side reactors L1 and a plurality of negative side reactors L2, and a controller 5.

[1.1. Power Source 2]

The two power sources 2 are examples of a first power supply source and a second power supply source. Each of the power sources 2 is capable of supplying three-phase AC voltage (in the present embodiment, for example, voltage of U phase, V phase, and W phase). Each of the two power sources 2 may be a three-phase four-wire system or a three-phase three-wire system. In the present embodiment, for example, each of the two power sources 2 is the three-phase four-wire system, and includes a power source 2(1) which supplies three-phase AC voltage of U(1) phase, V(1) phase, and W(1) phase with respect to N(1) phase and a power source 2(2) which supplies three-phase AC voltage of U(2) phase, V(2) phase, and W(2) phase with respect to N(2) phase. Note that the N(1) phase and the N(2) phase are neutral phases and may be grounded.

The power sources 2(1), 2(2) may be power sources of the same type or power sources of different types. The power sources of the same type may be power sources that are identical in all of voltage, current, frequency, and phase, and the power sources of different types may be power sources that differ from each other in at least one of voltage, current, frequency, and phase. The power sources 2(1), 2(2) may be commercial power supplies of separate electric power systems or separate uninterruptible power supplies. In the present embodiment, for example, the power source 2(1) may be a commercial power supply, and the power source 2(2) may be an emergency power supply of self-power generation.

[1.2. Rectifier Circuit 3]

Each of the rectifier circuits 3 includes an AC input terminal 31 to which AC power is supplied from the power source 2, and rectifies current flowing between the AC input terminal 31 and the positive side output terminal 101 and between the AC input terminal 31 and the negative side output terminal 102. For example, each of the rectifier circuits 3 is provided for each phase of the three-phase AC voltage (in the present embodiment, for example, each of the U phase, the V phase, and the W phase) and for each of the power sources 2(1), 2(2). In the present embodiment, for example, the rectifier circuits 3 include a rectifier circuit $3_U(1)$ which rectifies U(1)-phase current from the power source 2(1), a rectifier circuit $3_U(2)$ which rectifies U(2)-phase current from the power source 2(2), a rectifier circuit $3_V(1)$ which rectifies V(1)-phase current from the power source 2(1), a rectifier circuit $3_V(2)$ which rectifies V(2)-phase current from the power source 2(2), a rectifier circuit $3_W(1)$ which rectifies W(1)-phase current from the power source 2(1), and a rectifier circuit $3_W(2)$ which rectifies W(2)-phase current from the power source 2(2). Each of the rectifier circuits 3 includes, in addition to the AC input terminal 31, a positive side rectifier Th1 (also referred to as a positive side rectifier Th1(1) or Th1(2)) and a negative side rectifier Th2 (also referred to as a negative side rectifier Th2(1) or Th2(2)). Note that, in the rectifier circuits $3_U(1)$, $3_U(2)$, $3_V(1)$, $3_V(2)$ in the figure, some reference signs are omitted for simplified illustration.

The positive side rectifier Th1 is connected between the AC input terminal 31 and the positive side output terminal 101. The positive side rectifier Th1 is capable of controlling a conduction state in the forward direction from the AC input terminal 31 to the positive side output terminal 101, and interrupts current in the reverse direction. The positive side rectifier Th1 is provided with a positive side control terminal Th11 for controlling a conduction state in the forward direction of the positive side rectifier Th1. In the present embodiment, for example, the positive side rectifier Th1 is a thyristor, and the positive side control terminal Th11 is a gate. In this case, when a forward bias is applied to the positive side rectifier Th1 to turn on the positive side control terminal Th11, the positive side rectifier Th1 is turned on and brought into a conducting state in the forward direction. When the positive side control terminal Th11 is turned off (gated off), the positive side rectifier Th1 is turned off and brought into an interrupted state in the forward direction at the time point when current of the AC power becomes zero. The operating frequency of the positive side rectifier Th1 is the frequency of the AC power source, and is, for example, 50 or 60 Hz.

The negative side rectifier Th2 is connected between the AC input terminal 31 and the negative side output terminal 102. The negative side rectifier Th2 is capable of controlling a conduction state in the forward direction from the negative side output terminal 102 to the AC input terminal 31 and interrupts current in the reverse direction. The negative side rectifier Th2 is provided with a negative side control terminal Th21 for controlling a conduction state in the forward direction of the negative side rectifier Th2. In the present embodiment, for example, the negative side rectifier Th2 is a thyristor, and the negative side control terminal Th21 is a gate. In this case, when a forward bias is applied to the negative side rectifier Th2 to turn on the negative side control terminal Th21, the negative side rectifier Th2 is turned on and brought into a conducting state in the forward direction. When the negative side control terminal Th21 is turned off (gated off), the negative side rectifier Th2 is turned off and brought into an interrupted state in the forward direction at the time point when current of the AC power becomes zero. The operating frequency of the negative side rectifier Th2 is also the frequency of the AC power source, and is, for example, 50 or 60 Hz.

[1.3. Positive Side Capacitor Cd1 and Negative Side Capacitor Cd2]

The positive side capacitor Cd1 and the negative side capacitor Cd2 are connected in order in series between the positive side output terminal 101 and the negative side output terminal 102. Each of the positive side capacitor Cd1 and the negative side capacitor Cd2 holds a voltage of half an output voltage E between the positive side output terminal 101 and the negative side output terminal 102. A midpoint between the positive side capacitor Cd1 and the negative side capacitor Cd2 may be connected to terminals of the neutral phases N(1), N(2) of the respective power sources 2.

[1.4. Switching Circuit 4]

The switching circuits 4 switch paths of AC current from the power sources 2. For example, each of the switching circuits 4 is provided for each phase of the three-phase AC voltage (in the present embodiment, for example, each of the U phase, the V phase, and the W phase). In the present embodiment, for example, the switching circuits 4 include a switching circuit $4_U$ which switches a path of the U(1)-phase and U(2)-phase currents, a switching circuit $4_V$ which switches a path of the V(1)-phase and V(2)-phase currents, and a switching circuit $4_W$ which switches a path of the W(1)-phase and W(2)-phase currents. Each of the switching circuits 4 includes a positive side semiconductor switch Q1 and a negative side semiconductor switch Q2, and a positive side diode D1 and a negative side diode D2.

The positive side semiconductor switch Q1 and the negative side semiconductor switch Q2 are connected in order in parallel to the positive side capacitor Cd1 and the negative side capacitor Cd2 between the positive side output terminal 101 and the negative side output terminal 102. A midpoint between the positive side semiconductor switch Q1 and the negative side semiconductor switch Q2 is connected to the midpoint between the positive side capacitor Cd1 and the negative side capacitor Cd2. Each of the positive side semiconductor switch Q1 and the negative side semiconductor switch Q2 may be an IGBT, a MOSFET, or a bipolar transistor. The operating frequency of the positive side semiconductor switch Q1 and the negative side semiconductor switch Q2 is a high frequency such as 10 kHz. Each of the positive side semiconductor switch Q1 and the negative side semiconductor switch Q2 may include a wide bandgap semiconductor. The wide bandgap semiconductor is a semiconductor having a larger bandgap than a silicon semiconductor, and is, for example, SiC, GaN, diamond, AlN, AlGaN, or ZnO.

The positive side diode D1 and the negative side diode D2 are connected between the positive side semiconductor switch Q1 and the positive side output terminal 101 and between the negative side semiconductor switch Q2 and the negative side output terminal 102, respectively. In the present embodiment, for example, an anode of the positive side diode D1 may be connected to a positive side terminal of the positive side semiconductor switch Q1. Further, a cathode of the negative side diode D2 is connected to a negative side terminal of the negative side semiconductor switch Q2. Each of the positive side diode D1 and the negative side diode D2 may include a wide bandgap semiconductor.

[1.5. Positive Side Reactor L1 and Negative Side Reactor L2]

Each of the positive side reactors L1 is connected between the two rectifier circuits 3(1), 3(2) for each phase of the three-phase AC voltage and the positive side output terminal 101. In the present embodiment, for example, the positive side reactors L1 include a positive side reactor $L1_U$ which is connected between the U-phase rectifier circuits $3_U(1)$, $3_U(2)$ and the positive side output terminal 101, a positive side reactor $L1_V$ which is connected between the V-phase rectifier circuits $3_V(1)$, $3_V(2)$ and the positive side output terminal 101, and a positive side reactor $L1_W$ which is connected between the W-phase rectifier circuits $3_W(1)$, $3_W(2)$ and the positive side output terminal 101.

The positive side reactor L1 may be connected between a cathode of the positive side rectifier Th1 (the thyristor in the present embodiment) in each of the two rectifier circuits 3(1), 3(2) and the positive side semiconductor switch Q1 and the positive side diode D1. The positive side reactor L1 smooths DC current generated by rectification by the rectifier circuit 3. Instead of this/in addition to this, the positive side reactor L1 raises the voltage of the generated DC power.

Each of the negative side reactors L2 is connected between the two rectifier circuits 3(1), 3(2) for each phase of the three-phase AC voltage (in the present embodiment, for example, for each of the U phase, the V phase, and the W phase) and the negative side output terminal 102. In the present embodiment, for example, the negative side reactors L2 include a negative side reactor L2$_U$ which is connected between the U-phase rectifier circuits 3$_U$(1), 3$_U$(2) and the negative side output terminal 102, a negative side reactor L2$_V$ which is connected between the V-phase rectifier circuits 3$_V$(1), 3$_V$(2) and the negative side output terminal 102, and a negative side reactor L2$_W$ which is connected between the W-phase rectifier circuits 3$_W$(1), 3$_W$(2) and the negative side output terminal 102.

The negative side reactor L2 may be connected between an anode of the negative side rectifier Th2 (the thyristor in the present embodiment) in each of the two rectifier circuits 3(1), 3(2) and the negative side semiconductor switch Q2 and the negative side diode D2. The negative side reactor L2 smooths DC current generated by rectification by the rectifier circuit 3. Instead of this/in addition to this, the negative side reactor L2 raises the voltage of the generated DC power.

[1.6. Controller 5]

The controller 5 controls each unit of the power supply 1. The controller 5 may be an example of the apparatus, and includes a voltage measuring unit 50, a drive control unit 51, a determination unit 53, and a switching unit 54.

[1.6.1. Voltage Measuring Unit 50]

The voltage measuring unit 50 measures each instantaneous voltage of the three-phase AC voltage. In the present embodiment, for example, the voltage measuring unit 50 may measure each of instantaneous voltages V$_{inU}$(1), V$_{inV}$(1), V$_{inW}$(1), V$_{inU}$(2), V$_{inV}$(2), and V$_{inW}$(2) of the U(1) phase, the V(1) phase, the W(1) phase, the U(2) phase, the V(2) phase, and the W(2) phase. The voltage measuring unit 50 may measure the voltage using a voltage sensor. The voltage measuring unit 50 may measure the voltage of each phase at any position of the power supply 1. In the present embodiment, for example, the voltage measuring unit 50 measures the voltage between the power source 2 and the corresponding rectifier circuit 3. However, the voltage measuring unit 50 may measure the voltage between the rectifier circuit 3 and the positive side output terminal 101 or the negative side output terminal 102. In this case, the voltage measuring unit 50 may also detect which of the power sources 2(1), 2(2) is the cause of the measured voltage. The voltage measuring unit 50 supplies the measurement result to the drive control unit 51 and the determination unit 53.

[1.6.2. Drive Control Unit 51]

The drive control unit 51 controls the positive side semiconductor switch Q1 and the negative side semiconductor switch Q2. Details of the control of the positive side semiconductor switch Q1 and the negative side semiconductor switch Q2 will be described later.

[1.6.3. Determination Unit 53]

The determination unit 53 determines a state of the power source 2 based on a result of comparison between a comparison target value Σ corresponding to the sum of the n-th powers of the instantaneous voltages of the three-phase AC voltage and a reference value K. The determination unit 53 may calculate the comparison target value Σ at a period equal to an integral submultiple of the period of the three-phase AC voltage (in the present embodiment, for example, a half period) to perform the determination. Here, n is a positive even number such as 2 or 4, and is, for example, 2 in the present embodiment. The determination unit 53 includes a calculation unit 530, a first determination unit 531, and a second determination unit 532.

[1.6.3(1) Calculation Unit 530]

The calculation unit 530 calculates the comparison target value Σ. The calculation unit 530 may calculate each of a comparison target value Σ(1) of the power source 2(1) and a comparison target value Σ(2) of the power source 2(2). The calculation unit 530 supplies the calculated comparison target value Σ to each of the first determination unit 531 and the second determination unit 532.

In the present embodiment, for example, the comparison target value Σ(1) is the sum of squares of the instantaneous voltages of the three-phase AC voltage, that is, the sum of the square of the instantaneous voltage V$_{inU}$(1) of the U(1) phase, the square of the instantaneous voltage V$_{inV}$(1) of the V(1) phase, and the square of the instantaneous voltage V$_{inW}$(1) of the W(1) phase. However, the comparison target value Σ(1) may be a value obtained by performing addition or subtraction on the sum. Similarly, although the comparison target value Σ(2) is the sum the square of the instantaneous voltage V$_{inU}$(2) of the U(2) phase, the square of the instantaneous voltage V$_{inV}$(2) of the V(2) phase, and the square of the instantaneous voltage V$_{inW}$(2) of the W(2) phase, the comparison target value Σ(2) may be a value obtained by performing addition or subtraction on the sum.

The U-phase, V-phase, and W-phase instantaneous voltages are represented by the following formulae (1) to (3), respectively. Further, the comparison target value Σ is represented by the following formula (4). In the formulae, A denotes the amplitude of voltage.

$$V_{inU} = A \cdot \sin(\omega t) \qquad (1)$$

$$V_{inV} = A \cdot \sin(\omega t - 2/3\pi) \qquad (2)$$

$$V_{inW} = A \cdot \sin(\omega t - 4/3\pi) \qquad (3)$$

$$\Sigma = V_{inU}^2 + V_{inV}^2 + V_{inW}^2 = 3/2 \cdot A^2 \qquad (4)$$

As represented by formula (4), when the power source 2 is normal (also referred to as sound), the comparison target value Σ may be a constant value. Further, the comparison target value Σ may become zero when the power source 2 is in a power failure state such as an instantaneous interruption state and may periodically vary at twice the frequency of the power source 2 when the voltage of the power source 2 is in an instantaneous drop state.

[1.6.3(2) First Determination Unit 531]

The first determination unit 531 determines that the power source 2 is in an abnormal state (e.g., an instantaneous drop state) in response to the comparison target value Σ of the power source 2 intermittently falling below a first reference value K1 for a first reference time. The first determination unit 531 supplies the determination result to the switching unit 54.

The first reference value K1 may be a value between a value of the comparison target value Σ in a case where the power source 2 is normal and the minimum value of the comparison target value Σ in a case where the power source 2 is in an instantaneous drop state. For example, the first reference value K1 may be a value corresponding to 80% of the comparison target value Σ in a case where the power source 2 is normal. In the present embodiment, for example, the first reference value K1 used in the determination of the power source 2(1) and the first reference value K1 used in the determination of the power source 2(2) are the same value. However, these first reference values K1 may be different values.

The condition where the comparison target value Σ intermittently falls below the first reference value K1 may be a condition where a state in which the comparison target value Σ falls below the first reference value K1 is interrupted and continued, and may be a condition where the comparison target value Σ varies a plurality of times across the first reference value K1. When the comparison target value Σ intermittently falls below the first reference value K1, instantaneous current inside the power supply 1 increases by a drop of the instantaneous voltage. As a result, there is a possibility that elements inside the power supply 1 (in the present embodiment, for example, the positive side rectifier Th1, the negative side rectifier Th2, the positive side semiconductor switch Q1, the negative side semiconductor switch Q2, the positive side diode D1, and the negative side diode D2) become high temperatures or broken.

The first reference time may be shorter than the time from when a state in which the comparison target value Σ intermittently falls below the first reference value K1 starts to when the elements inside the power supply 1 become high temperatures or broken. In the present embodiment, for example, the first reference time is 10 seconds. The first reference time may be set according to the thermal capacity or the cooling capacity of the power supply 1. In the present embodiment, for example, the first reference time used in the determination of the power source 2(1) and the first reference time used in the determination of the power source 2(2) are the same time duration, but may be different time durations.

[1.6.3(3) Second Determination Unit 532]

The second determination unit 532 determines that the power source 2 is in an abnormal state (e.g., a power failure state) in response to the comparison target value Σ of the power source 2 falling below a second reference value K2 which is smaller than the first reference value K1. The second determination unit 532 supplies the determination result to the switching unit 54.

The second reference value K2 may be a value between a value of the comparison target value Σ in a case where the power source 2 is normal and the comparison target value Σ in a case where the power source 2 is in a power failure state. For example, the second reference value K2 may be a value corresponding to 70% of the comparison target value Σ in a case where the power source 2 is normal. The second reference value K may be a value corresponding to the comparison target value E in a case where the power supply 1 cannot perform rated output due to a drop in an input voltage or overcurrent protection for each element of the power supply 1 cannot be performed. In the present embodiment, for example, the second reference value K2 used in the determination of the power source 2(1) and the second reference value K2 used in the determination of the power source 2(2) are the same value. However, these second reference values K2 may be different values.

[1.6.4. Switching Unit 54]

The switching unit 54 switches the power source 2 to be used between the power sources 2(1), 2(2) based on the determination result of the determination unit 53. The switching unit 54 may control the positive side control terminal Th11 and the negative side control terminal Th21 of each of the rectifier circuits 3 to switch the power source 2 to be used. For example, the switching unit 54 performs drive control so that the positive side rectifier Th1 and the negative side rectifier Th2 of the rectifier circuit 3 to which AC power from the power source 2 to be used is input are brought into conduction in the forward direction and interrupts the positive side rectifier Th1 and the negative side rectifier Th2 of the rectifier circuit 3 to which AC power from the power source 2 not to be used is input in the forward direction. The switching unit 54 may perform switching between the rectifier circuit 3 to be brought into conduction and the rectifier circuit 3 to be interrupted to switch the power source 2 to be used.

The switching unit 54 may perform switching so that the power source 2(1) is preferentially used. For example, the switching unit 54 switches the power source 2 to be used to the power source 2(1) when the determination unit 53 determines that the power source 2(1) is in a normal state, and switches the power source 2 to be used to the power source 2(2) when the determination unit 53 determines that the power source 2(1) is in an abnormal state. The power source 2(2) to be used may be in a normal state.

According to the power supply 1 described above, the state of the power source 2 is determined based on the result of the comparison between the comparison target value Σ corresponding to the sum of the n-th powers of the instantaneous voltages of the three-phase AC voltage and the reference value K. Thus, the configuration can be simplified as compared to the case where the ripple of the sum of squares is detected. Further, the state determination of the power source 2 can be performed in an instant differently from the case where determination is performed using voltage for a reference period. Thus, since an abnormal state of the power source 2 can be detected in an instant, it is possible to prevent breakage of the elements.

Further, the power source 2 is determined to be in an abnormal state in response to the comparison target value Σ intermittently falling below the first reference value for the first reference time, and the power source 2 is determined to be in an abnormal state in response to the comparison target value Σ falling below the second reference value. Thus, it is possible to detect each of an instantaneous drop in the voltage and a power failure in the power source 2 in an instant.

Further, the determination is performed at a period equal to an integral submultiple of the period of the three-phase AC voltage. Thus, an abnormal state can be detected at an early stage.

Further, the power source 2 to be used is switched between the power sources 2(1), 2(2) based on the determination result. Thus, it is possible to prevent the power source 2 in an abnormal state from being used.

Further, the power source 2 to be used is switched to the power source 2(1) when the power source 2(1) is determined to be in a normal state and switched to the power source 2(2) when the power source 2(1) is determined to be in an abnormal state. Thus, it is possible to preferentially use the power source 2(1) to reduce the use of the power source 2(2).

Further, each of the rectifier circuits 3 is provided with the positive side rectifier Th1 which is connected between the AC input terminal 31 and the positive side output terminal 101 and the negative side rectifier Th2 which is connected between the AC input terminal 31 and the negative side output terminal 102. The positive side rectifier Th1 is capable of controlling a conduction state in the forward direction from the AC input terminal 31 to the positive side output terminal 101, and interrupts current in the reverse direction. The negative side rectifier Th2 is capable of controlling a conduction state in the forward direction from the negative side output terminal 102 to the AC input terminal 31, and interrupts current in the reverse direction. Thus, the positive side rectifier Th1 and the negative side rectifier Th2 of each of the rectifier circuits 3 makes it possible to appropriately switch the AC power source to be used for supply without an instantaneous interruption.

Further, the positive side reactor L1 is connected between the two rectifier circuits 3(1), 3(2) of each phase and the positive side output terminal 101. The negative side reactor L2 is connected between the two rectifier circuits 3(1), 3(2) of each phase and the negative side output terminal 102. Thus, the positive side reactor L1 can be kept in a nonoperating state for a half period during which the polarity of the AC power source is on the negative voltage side, and the negative side reactor L2 can be kept in a nonoperating state for a half period during which the polarity of the AC power source is on the positive voltage side. Thus, an effective value of current in the reactor becomes $1/\sqrt{2}$ of a rated current to reduce heat generation. Accordingly, the positive side reactor L1 and the negative side reactor L2 can be made small as compared to the case where the reactor is connected between the rectifier circuit 3 and the AC power source. Further, such a configuration eliminates the necessary of providing a reactor for each of the power sources 2. Thus, two reactors can be provided regardless of the number of power sources 2.

[2. Drive Control Unit 51]

Figure 2:
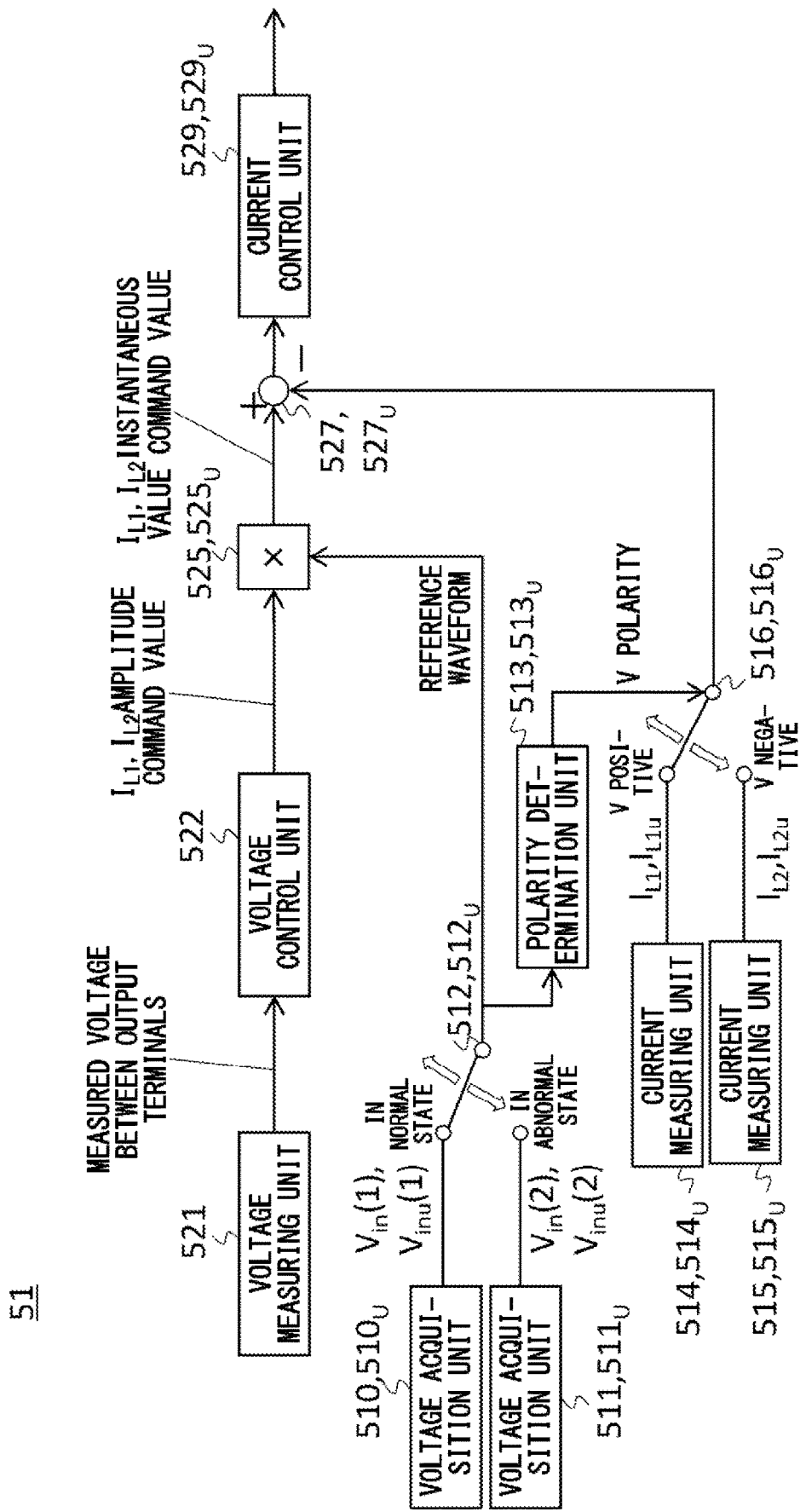
FIG. 2 illustrates a drive control unit 51 according to the present embodiment.

FIG. 2 illustrates the drive control unit 51 according to the present embodiment. The drive control unit 51 controls the positive side semiconductor switch Q1 and the negative side semiconductor switch Q2 to control at least either the voltage across the positive side capacitor Cd1 and the voltage across the negative side capacitor Cd2 or the current flowing through the positive side reactor L1 or the negative side reactor L2. The drive control unit 51 includes voltage acquisition units 510, 511, a switch 512, a polarity determination unit 513, current measuring units 514, 515, a switch 516, a voltage measuring unit 521, a voltage control unit 522, a multiplier 525, a subtracter 527, and a current control unit 529. The drive control unit 51 includes the voltage acquisition units 510, 511, the switch 512, the polarity determination unit 513, the current measuring units 514, 515, the switch 516, the multiplier 525, the subtracter 527, and the current control unit 529 for each of the U phase, the V phase, and the W phase. However, for simplification, FIG. 2 illustrates only voltage acquisition units $510_U$, $511_U$, a switch $512_U$, a polarity determination unit $513_U$, current measuring units $514_U$, $515_U$, a switch $516_U$, a multiplier $525_U$, a subtracter $527_U$, and a current control unit $529_U$ corresponding to the U phase.

The voltage acquisition unit 510 acquires a phase voltage $V_{in}(1)$ of the corresponding one of the phases of the power source 2(1) from the voltage measuring unit 50. For example, the voltage acquisition unit $510_U$ corresponding to the U phase acquires a phase voltage $V_{inU}(1)$ of the U phase. The voltage acquisition unit 510 supplies a value of the acquired phase voltage to the switch 512.

The voltage acquisition unit 511 acquires a phase voltage $V_{in}(2)$ of the corresponding one of the phases of the power source 2(2) from the voltage measuring unit 50. For example, the voltage acquisition unit $511_U$ corresponding to the U phase acquires a phase voltage $V_{inU}(2)$ of the U phase. The voltage acquisition unit 511 supplies a value of the acquired phase voltage to the switch 512.

The switch 512 selects AC power to be used from AC powers from the power sources 2(1), 2(2). In the present embodiment, for example, the switch 512 selects AC power of the power source 2(1) in a sound state and selects AC power of the power source 2(2) when an abnormality occurs. The switch 512 supplies a measured value of the phase voltage of the selected AC power to the polarity determination unit 513 and the multiplier 525.

The polarity determination unit 513 determines the polarity (positive or negative of the phase voltage) of the AC power selected by the switch 512. The polarity determination unit 513 supplies the determination result to the switch 516.

The current measuring unit 514 measures a current $I_{L1}$ flowing through the positive side reactor L1 of the corresponding phase among the positive side reactors L1 of the respective phases. For example, the current measuring unit $514_U$ corresponding to the U phase measures a current km flowing through the positive side reactor $L1_U$. The current measuring unit 514 may measure the current $I_{L1}$ using a current sensor. The current measuring unit 514 supplies a measured value of the current $I_{L1}$ to the switch 516.

The current measuring unit 515 measures a current $I_{L2}$ flowing through the negative side reactor L2 of the corresponding phase among the negative side reactors L2 of the respective phases. For example, the current measuring unit $515_U$ corresponding to the U phase measures a current $I_{L2U}$ flowing through the positive side reactor $L2_U$. The current measuring unit 515 may measure the current $I_{L2}$ using a current sensor. The current measuring unit 515 supplies a measured value of the current $I_{L2}$ to the switch 516.

The switch 516 selects either of the measured current values $I_{L1}$, $I_{L2}$ according to the determination result of the polarity determination unit 513. For example, the switch 516 selects the measured value $I_{L1}$ when the phase voltage of the AC power to be used is positive, that is, current flows through the positive side reactor L1. The switch 516 selects the measured value $I_{L2}$ when the phase voltage of the AC power to be used is negative, that is, current flows through the negative side reactor L2.

The voltage measuring unit 521 measures a voltage between the positive side output terminal 101 and the negative side output terminal 102. The voltage measuring unit 521 may measure the voltage using a voltage sensor. The voltage measuring unit 521 supplies the measurement result to the voltage control unit 522.

The voltage control unit 522 calculates an amplitude command value of the current $I_{L1}$ or $I_{L2}$ of the reactor L1 or L2 from the measured value of the voltage. The amplitude command value may equal between the phases. The voltage control unit 522 supplies the amplitude command value to the multiplier 525.

The multiplier 525 multiplies the amplitude command value from the voltage control unit 522 and an instantaneous value of the input voltage $V_{in}(1)$ or $V_{in}(2)$ from the switch 512 of the corresponding phase to calculate an instantaneous current command value having a similar waveform to the input voltage. For example, the multiplier $525_U$ corresponding to the U phase multiplies the amplitude command value by a measured instantaneous value $V_{inU}(1)$ or $V_{inU}(2)$ of the U-phase voltage to calculate a U-phase instantaneous current command value. The multiplier 525 supplies the instantaneous current command value to the subtracter 527.

The subtracter 527 subtracts the measured value of the current $I_{L1}$ or $I_{L2}$ of the positive side reactor L1 or the negative side reactor L2 of the corresponding phase from the instantaneous current command value to calculate an error current. For example, the subtracter $527_U$ corresponding to the U phase subtracts the measured value of the current $I_{L1U}$ or $I_{L2U}$ from the U-phase instantaneous current command value to calculate the error current. The subtracter 527 supplies the error current to the current control unit 529.

The current control unit 529 controls on/off of the positive side semiconductor switch Q1 or the negative side semiconductor switch Q2 in the switching circuit 4 of the corresponding phase so that the error current of the corresponding phase becomes zero, that is, the measured value of the current $I_{L1}$ or $I_{L2}$ coincides with the instantaneous current command value. For example, the current control unit $529_U$ corresponding to the U phase controls on/off of the positive side semiconductor switch Q1 or the negative side semiconductor switch Q2 in the switching circuit $4_U$ so that the error current of the U phase becomes zero. The current increases when the switch is on and decreases when the switch is off. Thus, the voltage across the positive side capacitor Cd1 and the voltage across the negative side capacitor Cd2 and/or the currents $I_{L1}$, $I_{L2}$ flowing through the positive side reactor L1 and the negative side reactor L2 are controlled by controlling the ratio thereof.

[3. Operation in Normal State]

Figure 3:
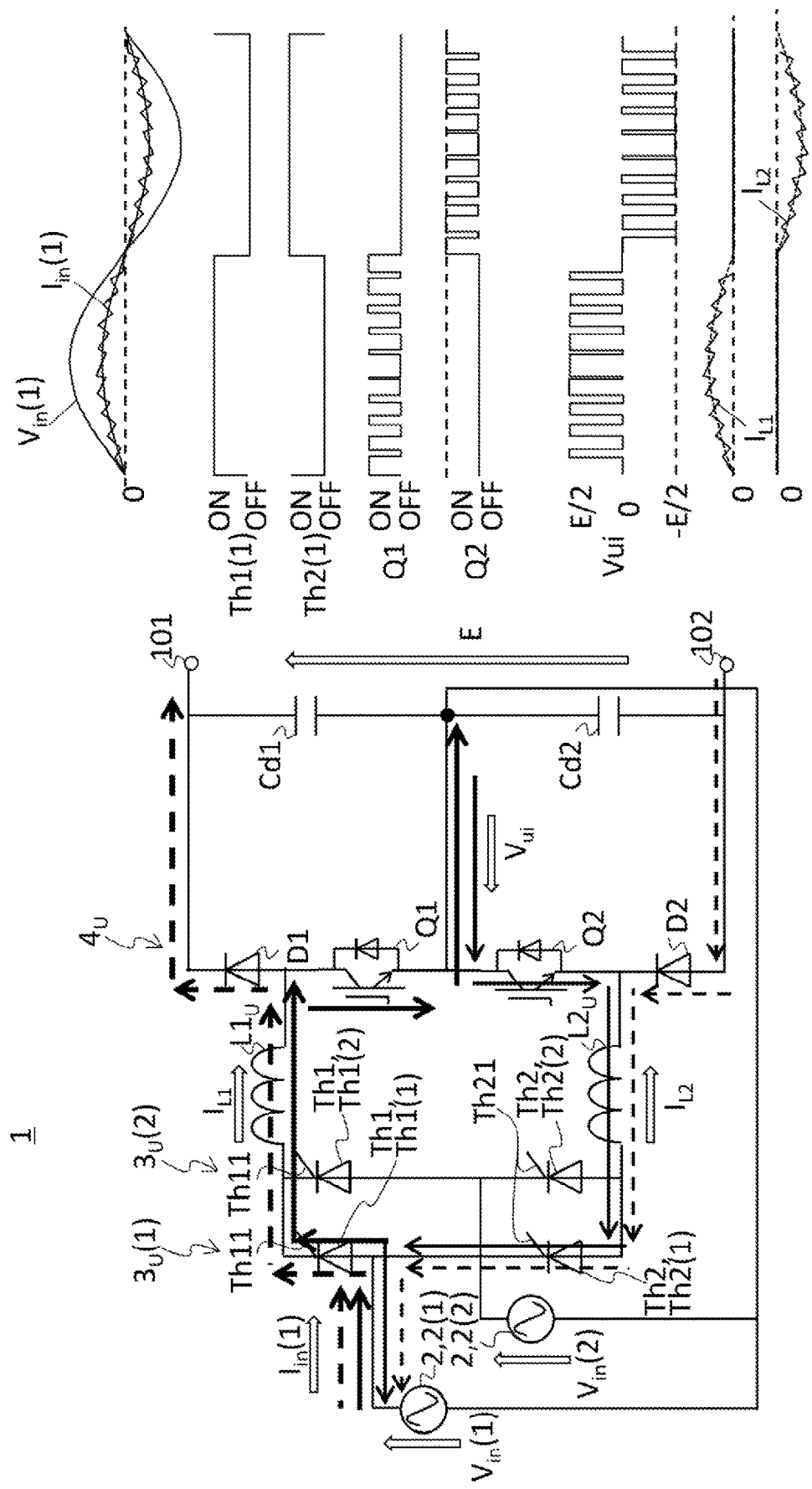
FIG. 3 illustrates an operation of the power supply 1 when a power source 2(1) is normal.
Figure 4:
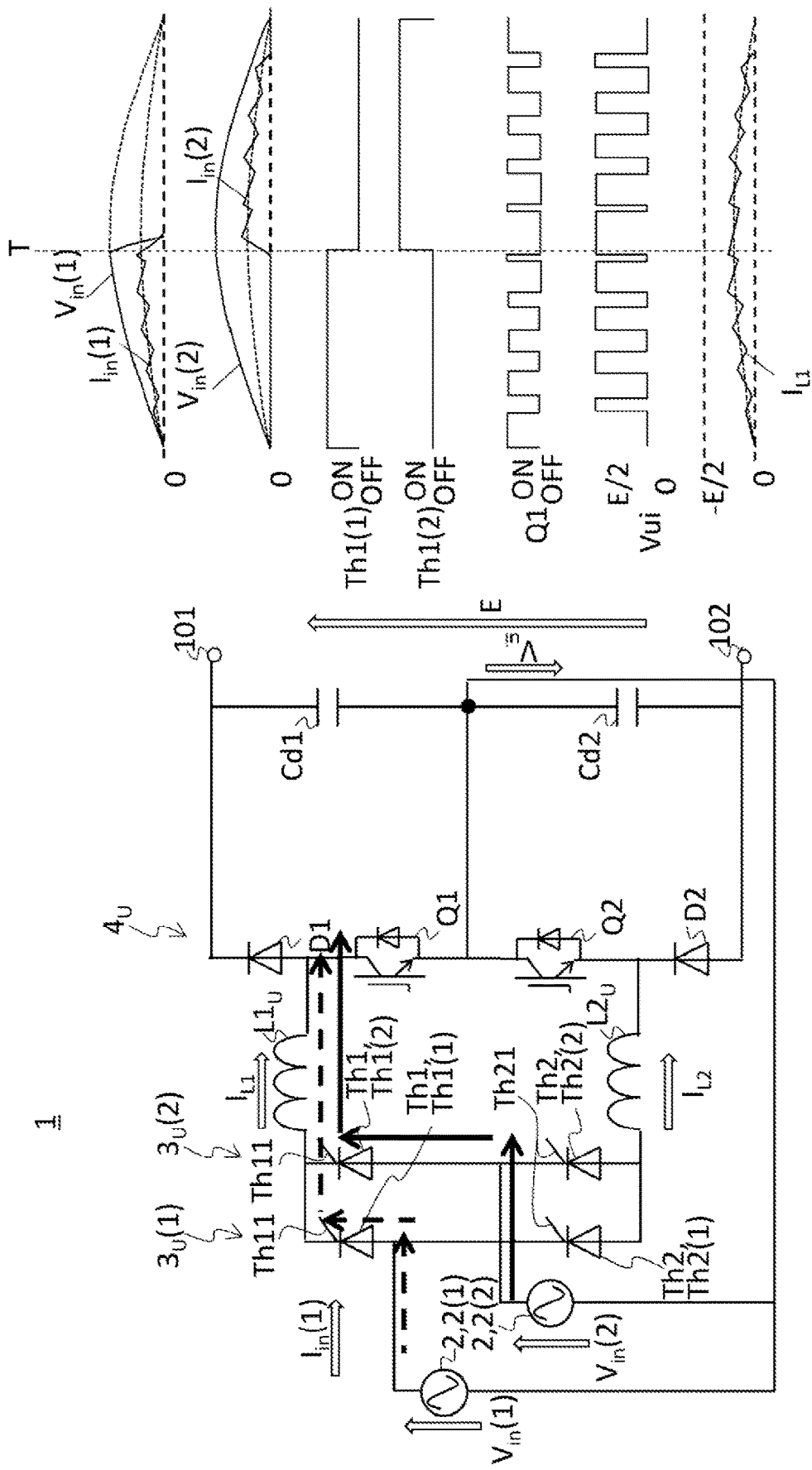
FIG. 4 illustrates an operation of the power supply 1 when the power source 2(1) is abnormal.
Figure 5:
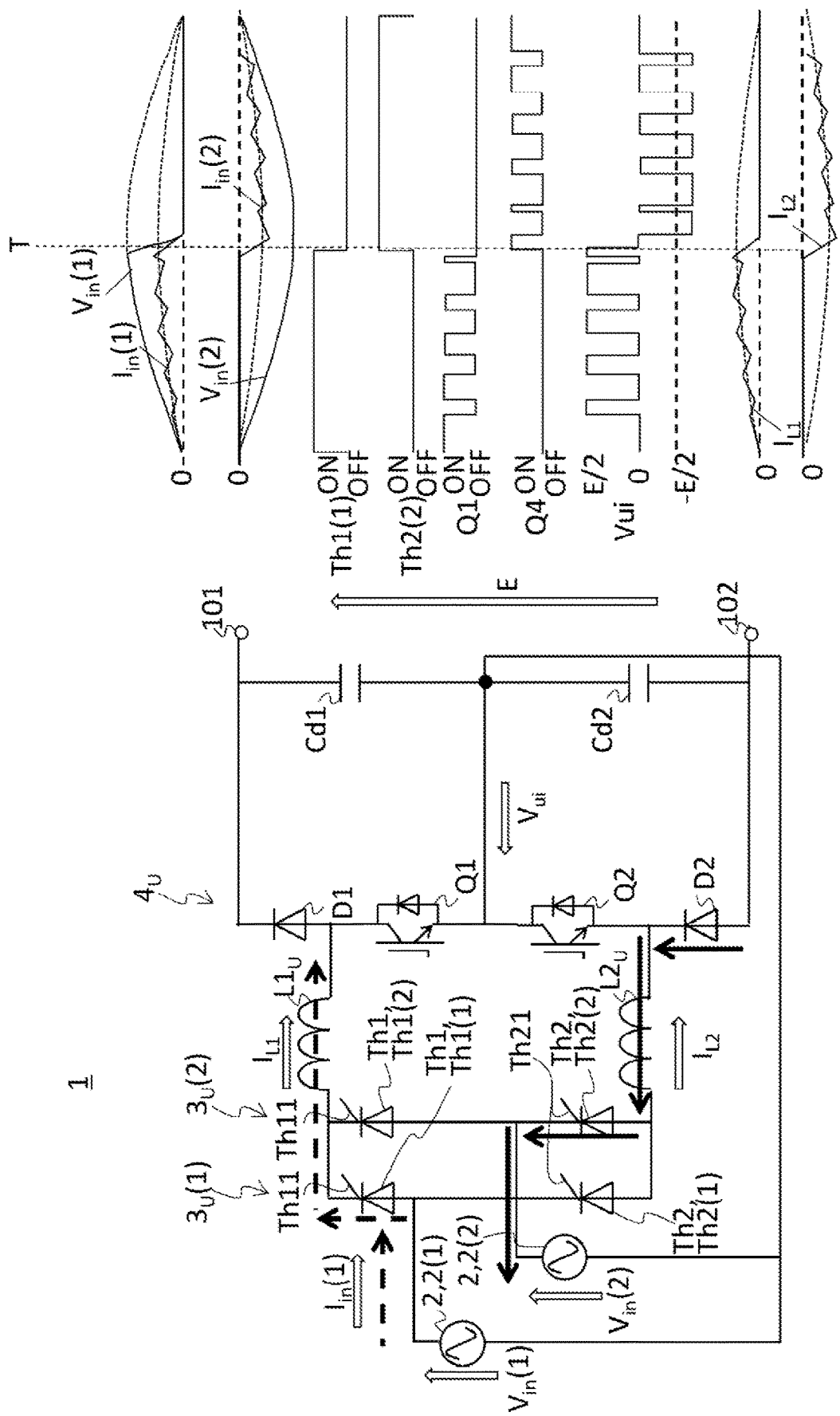
FIG. 5 illustrates another operation of the power supply 1 when the power source 2(1) is abnormal.

FIG. 3 illustrates an operation of the power supply 1 when the power source 2(1) is normal. Operations for the respective phases of the three-phase AC voltage are similar to each other. Thus, only the operation for the U phase is illustrated in FIGS. 3, and 4 and 5 (described later). Further, in FIG. 3, the controller 5 is omitted. Further, open arrow symbols represent voltage or current in a circuit diagram on the left side of the figure. Further, a graph on the right side of the figure shows changes in the voltage or current represented by the open arrow symbols and operating waveforms of the respective elements.

In the present embodiment, for example, since the power source 2(2) is not used when the power source 2(1) is normal, the switching unit 54 interrupts the rectifier circuit $3_U(2)$ for inputting AC power from the power source 2(2). For example, the switching unit 54 controls the positive side control terminal Th11 and the negative side control terminal Th21 of the rectifier circuit $3_U(2)$ so as to interrupt the positive side rectifier Th1(2) and the negative side rectifier Th2(2) of the rectifier circuit $3_U(2)$ for inputting AC power from the power source 2(2) not to be used in the forward direction. For example, the switching unit 54 may gate off the positive side rectifier Th1(2) and the negative side rectifier Th2(2).

Further, the switching unit 54 brings the rectifier circuit $3_U(1)$ to which power is supplied from the power source 2(1) into conduction to cause the rectifier circuit $3_U(1)$ to perform rectification. The voltage supplied from the power source 2(1) is represented by the graph of $V_{in}(1)$ in the figure.

For example, the switching unit 54 controls the positive side control terminal Th11 and the negative side control terminal Th21 of the rectifier circuit $3_U(1)$ so as to bring the positive side rectifier Th1 and the negative side rectifier Th2 of the rectifier circuit $3_U(1)$ to which power is supplied from the power source 2(1) to be used into conduction in the forward direction. Accordingly, the voltage and current represented by the graphs of $V_{in}(1)$ and $I_{in}(1)$ in the figure are supplied from the power source 2(1).

For example, as represented by thick solid line and thick broken line arrow symbols on the left side of the figure and the graphs of $V_{in}(1)$, Th1(1) on the right side of the figure, the switching unit 54 controls the positive side control terminal Th11 of the rectifier circuit $3_U(1)$ so as to bring the positive side rectifier Th1(1) into conduction in the forward direction in at least a part of a period during which the U-phase power of the power source 2(1) to be used is positive voltage. The switching unit 54 may control the positive side control terminal Th11 so as to interrupt the positive side rectifier Th1 in the forward direction in at least a part of the period during which the U-phase voltage of the power source 2(1) to be used is positive voltage. For example, $I_{in}(1)$ becomes zero at zero cross when the polarity of the U-phase voltage shifts to negative and Th11 becomes completely off at this point merely by turning on the gate only for a beginning period of the positive-voltage period. In the present embodiment, for example, the switching unit 54 maintains the positive side control terminal Th11 on over the entire period during which the U-phase voltage is positive voltage and maintains the positive side control terminal Th11 off over the entire period during which the U-phase voltage is negative voltage. The switching unit 54 may maintain the positive side control terminal Th11 on regardless of positive or negative of the U-phase voltage. However, in this case, power consumption increases.

Further, as represented by thin solid line and thin broken line arrow symbols on the left side of the figure and the graphs of $V_{in}(1)$, Th2(1) on the right side of the figure, the switching unit 54 controls the negative side control terminal Th21 of the rectifier circuit $3_U(1)$ so as to bring the negative side rectifier Th2(1) into conduction in the forward direction in at least a part of a period during which the U-phase power of the power source 2(1) to be used is negative voltage. The switching unit 54 may control the negative side control terminal Th21 so as to interrupt the negative side rectifier Th2(1) in the forward direction in at least a part of the period during which the U-phase power of the power source 2(1) to be used is positive voltage. For example, $I_{in}(1)$ becomes zero at zero cross when the polarity of the U-phase voltage shifts to positive and Th21 becomes completely off at this point merely by turning on the gate only for a beginning period of the negative-voltage period. In the present embodiment, for example, the switching unit 54 maintains the negative side control terminal Th21 on over the entire period during which the U-phase voltage is negative voltage and maintains the negative side control terminal Th21 off over the entire period during which the U-phase voltage is positive voltage. The switching unit 54 may maintain the negative side control terminal Th21 on regardless of positive or negative of the U-phase voltage. However, in this case, power consumption increases.

Further, the drive control unit 51 controls the positive side semiconductor switch Q1 and the negative side semiconductor switch Q2 of the switching circuit $4_U$.

For example, as represented by the graphs of Q1, Q2 on the right side of the figure, the drive control unit 51 maintains the negative side semiconductor switch Q2 off for the entire period during which the U-phase voltage of the power source 2(1) to be used is positive voltage, and turns on and off the positive side semiconductor switch Q1. When the positive side semiconductor switch Q1 is turned on, as represented by the thick solid line arrow symbols on the left side of the figure, the current from the power source 2(1) flows to the power source 2(1) through the positive side rectifier Th1(1), the positive side reactor L1, the positive side semiconductor switch Q1, and the midpoint between the positive side capacitor Cd1 and the negative side capacitor Cd2 in this order. Further, the voltage of the power source 2(1) is applied to the positive side reactor $L1_U$ to increase the current of the positive side reactor $L1_U$. When the positive side semiconductor switch Q1 is turned off, as represented by the thick broken line arrow symbols on the left side of the figure and the graphs of Vui on the right side of the figure, the current from the power source 2(1) flows to the power source 2(1) through the positive side rectifier Th1(1), the positive side reactor L1, the positive side diode D1, the positive side capacitor Cd1, and the midpoint between the positive side capacitor Cd1 and the negative side capacitor Cd2 in this order, and energy of the positive side reactor $L1_U$ is transmitted to the positive side capacitor Cd1. Further, as represented by the graph of $I_{L1}$ on the right side of the figure, a differential voltage between the voltage of the positive side capacitor Cd1 and the U-phase voltage of the power source 2(1) (in the present embodiment, a voltage in the direction opposite to a voltage when the positive side semiconductor switch Q1 is on) is applied to the positive side reactor $L1_U$ to reduce the current thereof. The drive control unit 51 can control the current from the power source 2(1) to any instantaneous value and set the voltage across the positive side capacitor Cd1 to any value higher than a voltage peak value of the power source 2(1) by controlling an on/off time ratio of the positive side semiconductor switch Q1.

Similarly, the drive control unit 51 maintains the positive side semiconductor switch Q1 off for the entire period during which the U-phase voltage of the power source 2(1) to be used is negative voltage, and turns on and off the negative side semiconductor switch Q2. Accordingly, the voltage across the negative side capacitor Cd2 is set to any value higher than the voltage peak value of the power source 2(1), for example, to the same voltage as the positive side capacitor Cd1.

According to the above configuration, the U-phase power from the power source 2(1) is converted to DC power and held by the positive side capacitor Cd1 and the negative side capacitor Cd2, and output from the positive side output terminal 101 and the negative side output terminal 102.

[4. Operation (1) in Abnormal State]

FIG. 4 illustrates the operation of the power supply 1 when the power source 2(1) is abnormal. In the present operation example, for example, the power source 2(1) and the power source 2(2) are power sources of the same type that are identical in each of voltage, current, frequency, and phase.

The switching unit 54 switches the power source 2 to be used from the power source 2(1) to the power source 2(2) when the power source 2(1) is determined to be abnormal. The switching unit 54 may switch the power source 2 at a switching time point T when the power source 2 should be switched.

For example, the switching unit 54 controls the positive side control terminal Th11 and the negative side control terminal Th21 of the rectifier circuit $3_U(1)$ so as to interrupt the positive side rectifier Th1(1) and the negative side rectifier Th2(1) of the rectifier circuit $3_U(1)$ in the forward direction. In the present embodiment, the polarity of the U-phase voltage of the power source 2(1) is positive at the switching time point T. Thus, only the positive side control terminal Th11 may be turned off at the time point when an abnormality of the voltage of the power source 2(1) is detected. Accordingly, when a power failure or the like occurs in the power source 2(1), the supply of power is naturally interrupted at the point when the current from the power source 2(1) becomes zero. Thus, as represented by the graph of $I_{in}(1)$ in the figure, the supply of current from the power source 2(1) is stopped.

Further, the switching unit 54 controls the positive side control terminal Th11 and the negative side control terminal Th21 of the rectifier circuit $3_U(2)$ so as to bring the positive side rectifier Th1(2) and the negative side rectifier Th2(2) of the rectifier circuit $3_U(2)$ into conduction in the forward direction. The switching unit 54 may control the rectifier circuit $3_U(2)$ in a manner similar to the control of the rectifier circuit $3_U(1)$ in a case where the power source 2(1) in a normal state is used. Accordingly, as indicated from broken line arrow symbols to solid line arrow symbols on the left side of the figure, the AC power to be used and a path thereof are switched. In the present operation example, the power sources 2(1), 2(2) have the same phase. Thus, as represented by the graphs of $V_{in}(1)$, $V_{in}(2)$ $I_{in}(1)$ $I_{in}(2)$ in the figure, the AC power to be used is switched with the AC powers input to the rectifier circuits $3_U(1)$, $3_U(2)$ synchronous with each other.

The drive control unit 51 may control the positive side semiconductor switch Q1 and the negative side semiconductor switch Q2 of the switching circuit $4_U$ in a manner similar to the control in a normal state.

[4.1. Switching Time Point T]

The switching time point T may be the time point when the determination unit 53 determines that the power source 2(1) is abnormal. For example, the switching time point T may be the time point when an abnormality (in the present embodiment, for example, a power failure) occurs in the power source 2(1) as represented by the graph of $V_{in}(1)$ in the figure.

The switching time point T may be asynchronous with the phase of the power sources 2(1), 2(2). For example, the switching time point T may be determined regardless of the phase of the power sources 2(1), 2(2). The switching time point T may be synchronous with the phase of the power sources 2(1), 2(2). For example, the switching time point T may be the time point when the voltages $V_{in}(1)$, $V_{in}(2)$ of the power sources 2(1), 2(2) cross zero after the determination unit 53 determines that the power source 2(1) is abnormal.

According to the above operation, when the power source 2 to be used is switched, the positive side control terminal Th11 and the negative side control terminal Th21 of the rectifier circuit $3_U(1)$ are controlled so as to interrupt the positive side rectifier Th1(1) and the negative side rectifier Th2(1) of the rectifier circuit $3_U(1)$ in the forward direction, and the positive side control terminal Th11 and the negative side control terminal Th21 of the rectifier circuit $3_U(2)$ are controlled so as to bring the positive side rectifier Th1(2) and the negative side rectifier Th2(2) of the rectifier circuit $3_U(2)$ into conduction in the forward direction. Thus, it is possible to stop the supply of AC power before the switching and start the supply of AC power after the switching.

Further, the power source 2 to be used is switched asynchronously with the phase of the power sources 2(1), 2(2). Thus, it is possible to perform the switching without waiting for the synchronous time point. Thus, when power is switched in response to the occurrence of an abnormality, an instantaneous interruption of power supply can be prevented.

[5. Operation (2) in Abnormal State]

FIG. 5 illustrates another operation of the power supply 1 when the power source 2(1) is abnormal. In the present operation example, for example, the power source 2(1) and the power source 2(2) are not synchronous with each other, and have a phase difference. FIG. 5 illustrates a case where there is a phase shift of 180°.

The switching unit 54 switches the power source 2 to be used from the power source 2(1) to the power source 2(2) when the power source 2(1) is determined to be abnormal. The switching unit 54 may switch the power source 2 at the switching time point T when the power source 2 should be switched. The switching time point T may be synchronous or asynchronous with the phase of either of the power sources 2(1), 2(2). In the present operation example, for example, the switching time point T is the time point when an abnormality occurs in the power source 2(1) and the time point when the AC power of the power source 2(1) is positive voltage and the AC power of the power source 2(2) is negative voltage as represented by the graph of $V_{in}$ (1) in the figure.

The switching unit 54 controls the positive side control terminal Th11 and the negative side control terminal Th21 of the rectifier circuit $3_U(1)$ so as to interrupt the positive side rectifier Th1(1) and the negative side rectifier Th2(1) of the rectifier circuit $3_U(1)$ in the forward direction. Accordingly, the U-phase power supply from the power source 2(1) is stopped.

Further, the switching unit 54 controls the positive side control terminal Th11 and the negative side control terminal Th21 of the rectifier circuit $3_U(2)$ so as to bring the positive side rectifier Th1(2) and the negative side rectifier Th2(2) of the rectifier circuit $3_U(2)$ into conduction in the forward direction. The switching unit 54 may control the rectifier circuit $3_U(2)$ in a manner similar to the control of the rectifier circuit $3_U(1)$ in a case where the power source 2(1) in a normal state is used. In the present operation example, there is a phase difference of 180° between the power sources 2(1), 2(2), and the U-phase of the power source 2(1) is positive voltage and the U-phase of the power source 2(2) is negative voltage at the switching time point T. Thus, the positive side rectifier Th(1) of the rectifier circuit $3_U(1)$ is switched from on to off, and the negative side rectifier Th(2) of the rectifier circuit $3_U(2)$ is switched from off to on at the switching time point T. Accordingly, as indicated from the broken line arrow symbols to the solid line arrow symbols on the left side of the figure, the AC power to be used is switched to change the flow of current.

Further, the drive control unit 51 controls the positive side semiconductor switch Q1 and the negative side semiconductor switch Q2 of the switching circuit $4_U$ according to positive or negative of the U-phase voltage supplied before and after the switching. In the present operation example, as described above, there is a phase difference of 180° between the power sources 2(1), 2(2), and the U-phase of the power source 2(1) is positive voltage and the U-phase of the power source 2(2) is negative voltage at the switching time point T. Thus, at the switching time point T, switching is performed from the control in which the negative side semiconductor switch Q2 is maintained off and the positive side semiconductor switch Q1 is turned on and off to the control in which the positive side semiconductor switch Q1 is maintained off and the negative side semiconductor switch Q2 is turned on and off. Accordingly, as represented by the graphs of $I_{L1}$, $I_{L2}$ on the right side of the figure, switching is performed from a state in which DC power arising from the power source 2(1) flows to the positive side reactor L1 and is held by the positive side capacitor Cd1 to a state in which DC power arising from the power source 2(2) flows to the negative side reactor L2 and is held by the negative side capacitor Cd2.

According to the above operation, when the power source 2 to be used is switched from the power source 2(1) to the power source 2(2) at the switching time point T when the power source 2(1) has positive voltage and the power source has negative voltage, current can flow from the positive side rectifier Th1 to the positive side reactor L1 until the AC voltage from the power source 2(1) becomes zero even by gating off the positive side rectifier Th1(1) and the negative side rectifier Th2(1) of the rectifier circuit $3_U(1)$. However, even when the positive side rectifier Th1(2) and the negative side rectifier Th2(2) of the rectifier circuit $3_U(2)$ are brought into conduction in the forward direction at this point so as to pass the current from the power source 2(2), no short-circuit path is formed. Thus, it is not necessary to delay the power supply from the power source 2(2) so as to prevent a short circuit, the power supply can be maintained without an instantaneous interruption. The positive side rectifier Th1(1) and the negative side rectifier Th2(1) of the rectifier circuit $3_U(1)$ and the positive side rectifier Th1(2) and the negative side rectifier Th2(2) of the rectifier circuit $3_U(2)$ may be temporarily brought into conduction in the respective forward directions to receive power supply from both of the power sources 2(1), 2(2). Current flowing to the positive side reactor L1 after the positive side rectifier Th1(1) of the rectifier circuit $3_U(1)$ is gated off is promptly attenuated by maintaining the positive side semiconductor switch Q1 off. In this manner, the present operation example makes it possible to switch the power source 2 to be used without an instantaneous interruption even when the power sources 2(1), 2(2) are not synchronous with each other in polarity, frequency, phase, and the like.

[6. Switching Process Between Power Sources 2]

Figure 6:
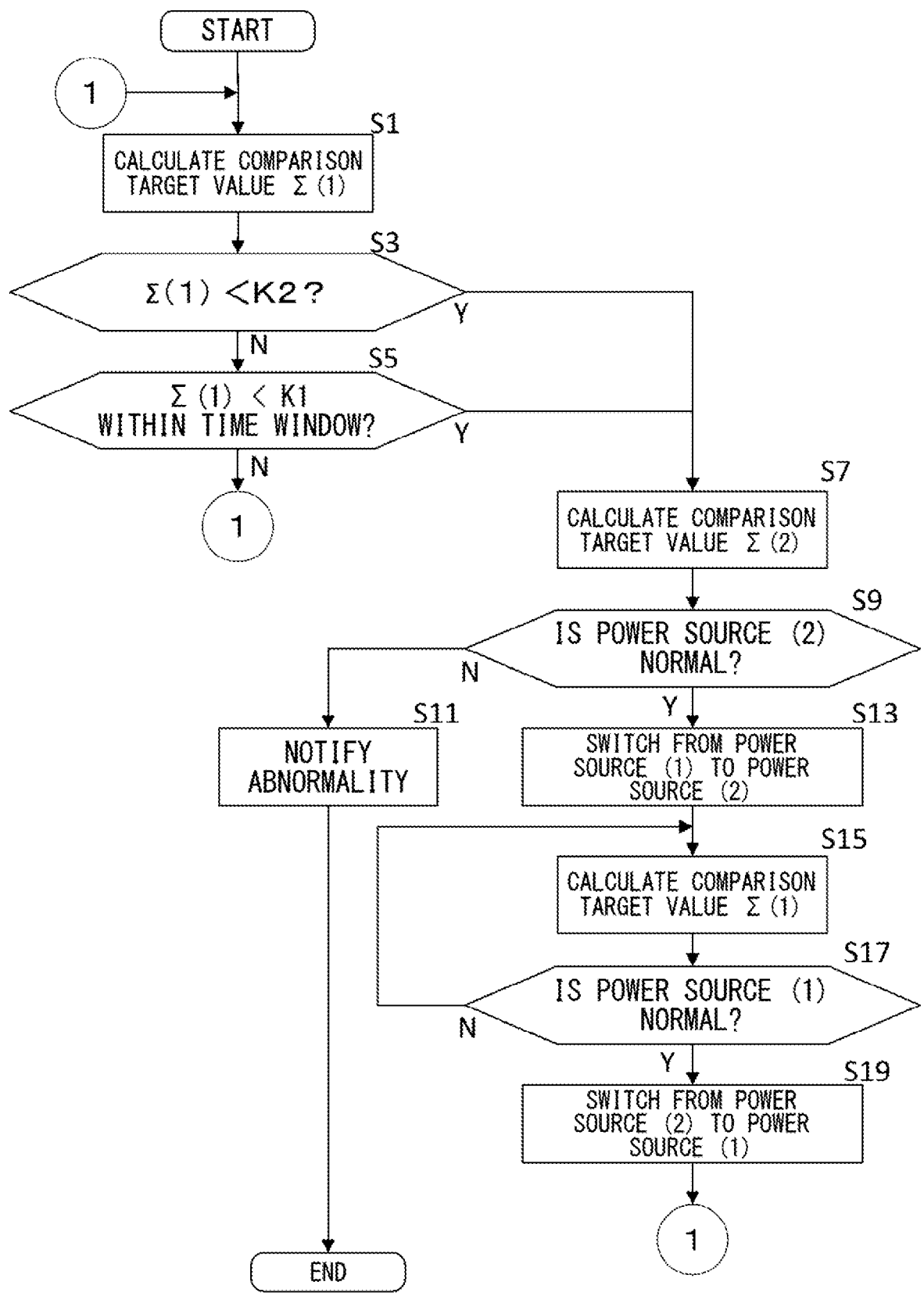
FIG. 6 illustrates a switching process between power sources 2 according to the present embodiment.

FIG. 6 illustrates a switching process between the power sources 2 according to the present embodiment. When the power source 2 has an abnormality, the controller 5 switches the power source 2 to be used by performing the process of steps S1 to S19. In the present embodiment, for example, the instantaneous voltages of the three-phase AC voltage are sequentially measured and supplied to the calculation unit 530 at a sampling period of 1 kHz or the like. However, the measurement may be performed at the calculation time point of the comparison target value Σ by the calculation unit 530.

In step S1, the calculation unit 530 calculates the comparison target value Σ(1) for the power source 2(1).

In step S3, the second determination unit 532 determines whether the power source 2(1) is in an abnormal state according to whether the comparison target value E(1) of the power source 2(1) falls below the second reference value K2. The second determination unit 532 may determine that the power source 2(1) is in an abnormal state in response to the comparison target value Σ(1) of the power source 2(1) falling below the second reference value K2.

When the power source 2(1) is determined to be in an abnormal state in step S3 (step S3; Yes), the controller 5 shifts the process to step S7. When the power source 2(1) is determined to be in a normal state (step S3; No), the controller 5 shifts the process to step S5.

In step S5, the first determination unit 531 determines whether the power source 2(1) is in an abnormal state according to whether the comparison target value Σ(1) intermittently falls below the first reference value K1 for the first reference time. The first determination unit 531 may determine that the power source 2(1) is in an abnormal state in response to the comparison target value Σ(1) intermittently falling below the first reference value K1 for the first reference time.

The first determination unit 531 may sequentially shift a time window having a time duration of the first reference time (in the present embodiment, for example, 10 seconds), and determine that the power source 2(1) is in an abnormal state in response to the comparison target value Σ(1) at each of a plurality of time points within the time window intermittently falling below the first reference value K1. For example, the first determination unit 531 may determine that the power source 2(1) is in an abnormal state in response to the comparison target value Σ(1) falling below the first reference value K1 at least at both ends of the time window. The first determination unit 531 may determine that the power source 2(1) is in an abnormal state in response to the comparison target value Σ(1) falling below the first reference value K1 a larger number of times than a reference number within the first reference time. For example, when a comparison period between the comparison target value $\Sigma(1)$ and the first reference value K1 is 100 Hz, and the first reference time is 10 seconds, that is, the number of comparisons within the first reference time is 1000, the reference number may be 800. The first determination unit 531 may not determine that the power source 2(1) has become an abnormal state when a period during which the comparison target value $\Sigma(1)$ is continuously equal to or higher than the first reference value K1 for a second reference time (in the present embodiment, for example, one second) which is shorter than the first reference time is present within the time window.

When the power source 2(1) is determined to be in an abnormal state in step S5 (step S5; Yes), the controller 5 shifts the process to step S7. When the power source 2(1) is determined to be in a normal state (step S5; No), the controller 5 shifts the process to step S1. The period in which the power source 2(1) is determined to be in a normal state in step S5, and the process is shifted to step S1 may be, for example, 100 Hz.

In step S7, the calculation unit 530 calculates the comparison target value $\Sigma(2)$ for the power source 2(2).

In step S9, the determination unit 53 determines whether the power source 2(2) as a switching target is normal. For example, the determination unit 53 may determine whether the power source 2(2) is normal by the first determination unit 531. In this case, the first determination unit 531 determines whether the power source 2(2) is in a normal state according to whether the comparison target value $\Sigma(2)$ is continuously equal to or higher than the first reference value K1 for the first reference time. The first determination unit 531 may determine that the power source 2(2) is in a normal state than a reference number the comparison target value $\Sigma(2)$ being continuously equal to or higher than the first reference value K1 for the first reference time. The determination unit 53 may determine whether the power source 2(2) is normal by each of the first determination unit 531 and the second determination unit 532, and perform the determination based on the logical AND of these determination results.

When the power source 2(2) is determined to be in a normal state in step S9 (step S9; Yes), the controller 5 shifts the process to step S13. When the power source 2(2) is determined to be in an abnormal state (step S9; No), the controller 5 shifts the process to step S11.

In step S11, the controller 5 may notify an operator that there are abnormalities in both of the power sources 2(1), 2(2) by notification means (not illustrated). After the process of step S11, the controller 5 may finish the process.

In step S13, the switching unit 54 switches the power source 2 to be used from the power source 2(1) to the power source 2(2). The switching unit 54 may switch the power source 2 to be used by controlling a conducting state and an interrupted state of the rectifier circuit 3. In the present embodiment, the power source 2(2) is for emergency. Thus, it is preferred to switch the power source 2 to be used from the power source 2(2) to the power source 2(1) when the power source 2(1) has returned to a normal state.

In step S15, the calculation unit 530 calculates the comparison target value $\Sigma(1)$ for the power source 2(1).

In step S17, the determination unit 53 determines whether the power source 2(1) has returned to a normal state. For example, the determination unit 53 may determine whether the power source 2(1) is normal by the first determination unit 531. In this case, the first determination unit 531 determines whether the power source 2(1) has become a normal state according to whether the comparison target value $\Sigma(1)$ is continuously equal to or higher than the first reference value K1 for the first reference time. For example, the first determination unit 531 may determine that the power source 2(1) has become a normal state in response to the comparison target value $\Sigma(1)$ being continuously equal to or higher than the first reference value K1 for the first reference time. The first determination unit 531 may add a hysteresis characteristic between the first reference value K1 for determining that the power source 2(1) has become an abnormal state from a normal state and the first reference value K1 for determining that the power source 2(1) has become a normal state from an abnormal state. For example, the first reference value K1 in step S17 may be higher than the first reference value K1 in step S5. The determination unit 53 may determine whether the power source 2(1) is normal by each of the first determination unit 531 and the second determination unit 532 and perform the determination based on the logical AND of these determination results.

When the power source 2(1) is determined to be in an abnormal state in step S17 (step S17; No), the controller 5 shifts the process to step S15. The period in which the power source 2(1) is determined to be in an abnormal state in step S17, and the process is shifted to step S15 may be, for example, 100 Hz. When the power source 2(1) is determined to be in a normal state (step S17; Yes), the controller 5 shifts the process to step S19.

In step S19, the switching unit 54 switches the power source 2 to be used from the power source 2(2) to the power source 2(1) in a manner similar to step S14 described above. Then, after the process of step S19, the controller 5 shifts the process to step S1. When the switching between the power sources 2 by steps S13, S19 is repeatedly performed by shifting the process to step S1, the switching unit 54 may switch the power source 2 to be used to the power source 2(2) regardless of the determination result of the determination unit 53 in response to a switching frequency exceeding a reference frequency (for example, three times per a minute). Accordingly, it is possible to prevent the power source 2 to be used from being frequently changed when the determination result is unstable.

According to the above switching process, after the power source 2(1) is determined to be in an abnormal state, it is determined that the power source 2(1) has become a normal state in response to the comparison target value $\Sigma(1)$ for the power source 2(1) being continuously equal to or higher than the first reference value for the first reference time. Thus, it is possible to prevent the power source 2(1) in an unstable state from being erroneously determined to be in a normal state and used.

Further, the power source 2 is determined to be in an abnormal state in response to the comparison target value $\Sigma$ at each of a plurality of time points within the time window, which is sequentially shifted, intermittently falling below the first reference value K1. Thus, it is possible to sequentially determine the presence or absence of an instantaneous drop in the power source 2.

Further, it is not determined that the power source 2 has become an abnormal state when the power source 2 has been determined to be in a normal state and the comparison target value $\Sigma$ is continuously equal to or higher than the first reference value K1 for the second reference time (for example, one second) within the time window. Thus, it is possible to prevent the power source 2 from being erroneously determined to be in an abnormal state.

Further, the power source 2 is determined to be abnormal in response to the comparison target value $\Sigma$ falling below the first reference value K1 a larger number of times than the reference number within the first reference time. Thus, it is possible to accurately perform the determination even when the frequency of the comparison target value Σ falling below the first reference value K1 is not constant.

Further, the first reference value K1 in step S17 in which it is determined that the power source 2(1) has become a normal state from an abnormal state is higher than the first reference value K1 in step S5 in which it is determined that the power source 2(1) has become an abnormal state to a normal state. Thus, when the comparison target value Σ varies near the first reference value K1, the determination result of a state of the power source 2(1) can be stabilized.

[7. Operation Example]

Figure 7:
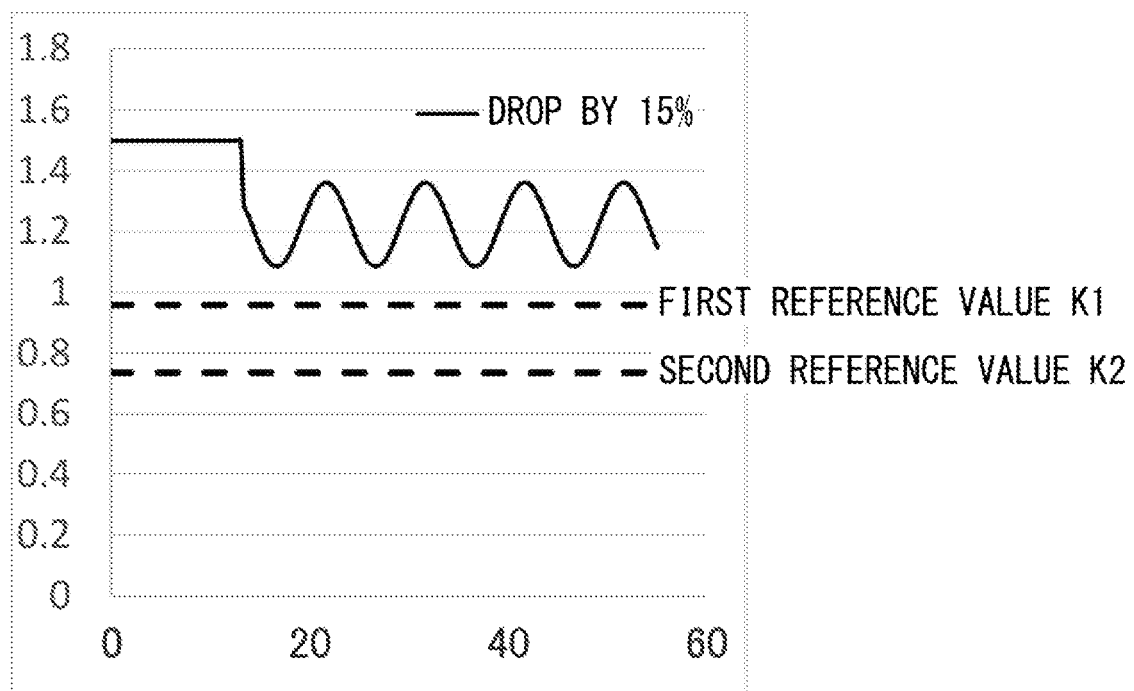
FIG. 7 illustrates a comparison target value $\Sigma(1)$ in a case where switching between the power sources 2 is not performed.
Figure 8:
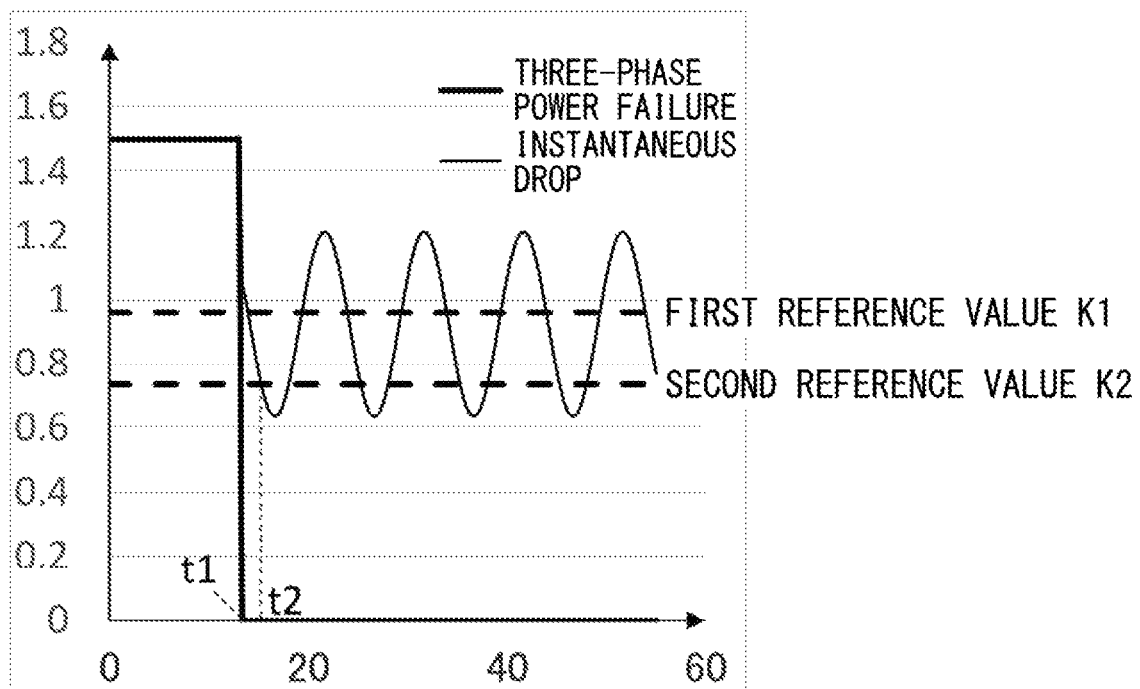
FIG. 8 illustrates the comparison target value $\Sigma(1)$ in a case where switching between the power sources 2 is performed.
Figure 9:
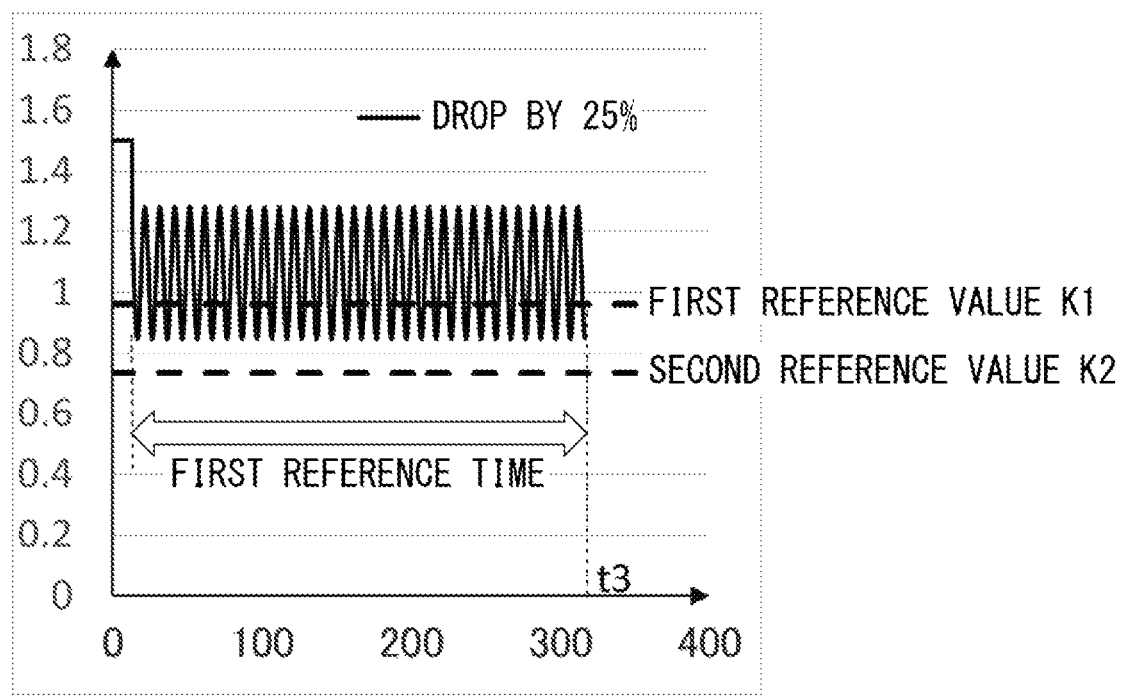
FIG. 9 illustrates the comparison target value $\Sigma(1)$ in a case where switching between the power sources 2 is performed.

FIG. 7 illustrates the comparison target value Σ(1) in a case where switching between the power sources 2 is not performed. In FIG. 7, and FIGS. 8 and 9 (described later), the vertical axis represents the comparison target value Σ, and the horizontal axis represents time (ms). In this operation example, as a result of an instantaneous drop of 15% in the voltage of the power source 2(1), the comparison target value Σ(1) varies above the first reference value K1. In this case, the power source 2(1) is not determined to be abnormal, and switching to the power source 2(2) is not performed.

FIG. 8 illustrates the comparison target value Σ(1) in a case where switching between the power sources 2 is performed. In the figure, a thick-line graph represents the comparison target value Σ(1) in a case where a power failure occurs in the U phase, the V phase, and the W phase, and a thin-line graph represents the comparison target value Σ(1) in a case where an instantaneous drop of 35% occurs in the voltage of the power source 2(1). In the operation examples indicated by the thick and thin lines, the comparison target value Σ(1) falls below the second reference value K2 at time points t1, t2. Thus, the power source 2(1) is determined to be abnormal, and switching to the power source 2(2) is performed.

FIG. 9 illustrates the comparison target value Σ(1) in a case where switching between the power sources 2 is performed. In this operation example, as a result of an instantaneous drop of 25% in the voltage of the power source 2(1), the comparison target value Σ(1) intermittently falls below the first reference value K1 for the first reference time. Thus, the power source 2(1) is determined to be abnormal, and switching to the power source 2(2) is performed at a time point t3.

[8. Modifications]

In the above embodiment, the power sources 2 are included in the power supply 1. However, the power sources 2 may be installed outside the power supply 1. Further, in the above description, the voltage measuring unit 50 and the drive control unit 51 are included in the controller 5. However, at least either the voltage measuring unit 50 or the drive control unit 51 may be installed outside the controller 5.

Further, in the above description, the determination unit 53 determines a state of each of the power sources 2(1), 2(2). However, the determination unit 53 may determine only a state of the power source 2(1) and may not perform determination on the power source 2(2). In this case, the controller 5 may perform switching to the power source 2(2) without performing the process of step 9 described above when the power source 2(1) is determined to be abnormal.

Further, in the above description, the positive side reactor L1 is connected between the two rectifier circuits 3(1), 3(2) of each phase and the positive side output terminal 101, and the negative side reactor L2 is connected between the two rectifier circuits 3(1), 3(2) of each phase and the negative side output terminal 102. However, in addition to this and/or instead of this, each reactor may be disposed at another position. For example, the reactor may be provided for each rectifier circuit 3. That is, the reactor may be provided corresponding to each of the plurality of rectifier circuits 3. For example, each reactor may be connected between the AC input terminal 31 of each of the rectifier circuits 3 and the corresponding power source 2(1), 2(2). In this case, some of the reactors corresponding to the power source 2 to be used are continuously kept in conduction regardless of positive or negative of voltage, and the other reactors are in a nonconducting state.

Further, in the above description, the positive side rectifier Th1 and the negative side rectifier Th2 are thyristors. However, each of the positive side rectifier Th1 and the negative side rectifier Th2 may be another semiconductor switch such as a reverse blocking IGBT. As described above, a semiconductor device having a self-arc-extinguishing ability tends to have a large loss. Thus, a low-loss device is preferably used.

Further, in the above embodiment, the instantaneous voltages of the three-phase AC voltage are the U, V, W-phase voltages. However, the instantaneous voltages may be UV, UW, and WU-interphase voltages.

Further, in the above description, the power source 2(2) is a three-phase AC power source. However, the power source 2(2) may be a DC power source. In this case, power from the power source 2(2) may be directly output from the positive side output terminal 101 and the negative side output terminal 102 without being supplied to the rectifier circuit 3.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA, C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

Figure 10:
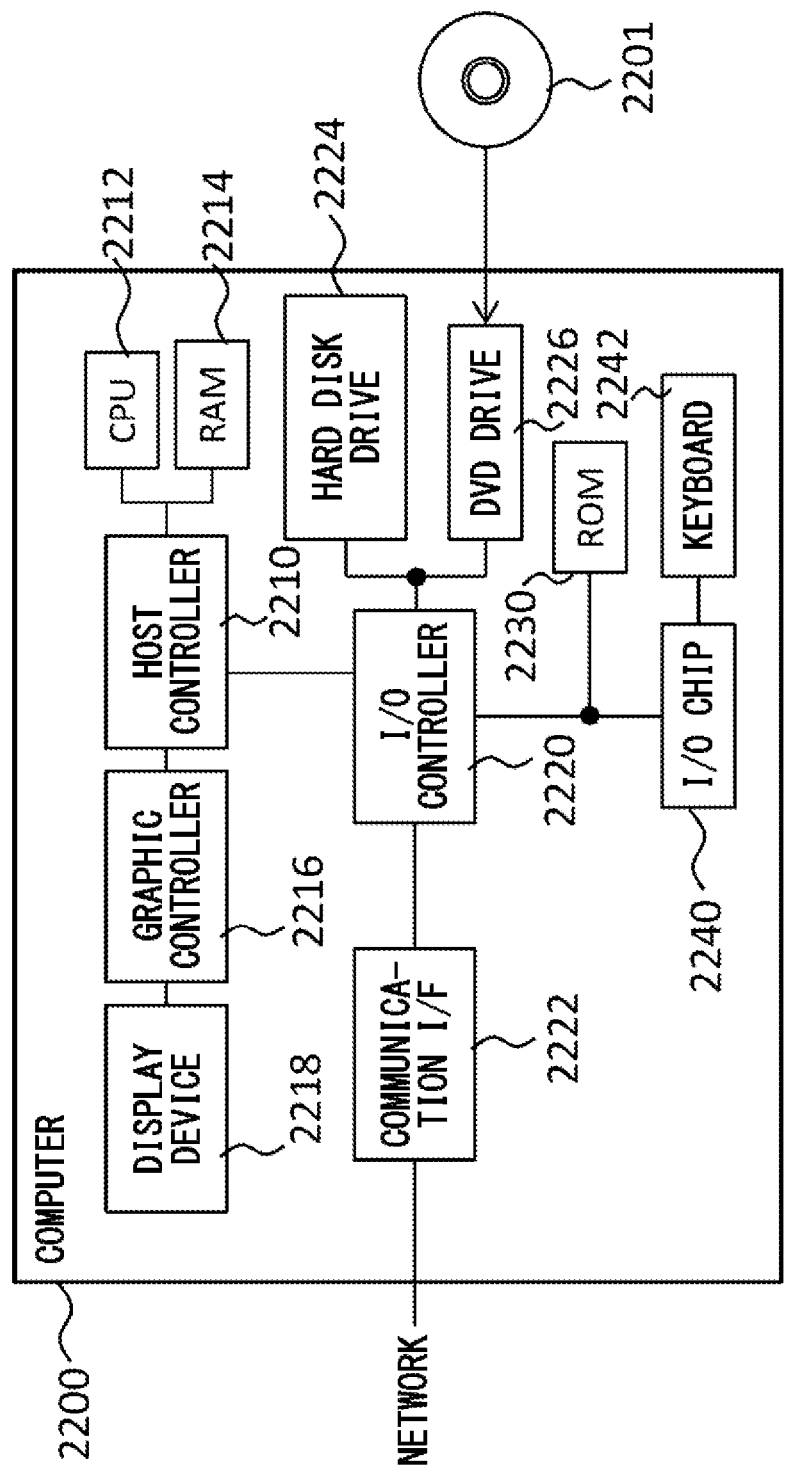
FIG. 10 shows an example of a computer 2200 in which embodiments of the present invention may be wholly or partly embodied.

FIG. 10 shows an example of a computer 2200 in which embodiments of the present invention may be wholly or partly embodied. A program that is installed in the computer 2200 can cause the computer 2200 to function as or perform operations associated with apparatuses of the embodiments of the present invention or one or more sections thereof, and/or cause the computer 2200 to perform processes of the embodiments of the present invention or steps thereof. Such a program may be executed by the CPU 2212 to cause the computer 2200 to perform certain operations associated with some or all of the blocks of flowcharts and block diagrams described herein.

The computer 2200 according to the present embodiment includes a CPU 2212, a RAM 2214, a graphics controller 2216, and a display device 2218, which are mutually connected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes legacy input/output units such as a ROM 2230 and a keyboard 2242, which are connected to the input/output controller 2220 through an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads programs and data from an IC card, and/or writes programs and data into the IC card.

The ROM 2230 stores therein a boot program or the like executed by the computer 2200 at the time of activation, and/or a program depending on the hardware of the computer 2200. The input/output chip 2240 may also connect various input/output units via a parallel port, a serial port, a keyboard port, a mouse port, and the like to the input/output controller 2220.

A program is provided by computer readable media such as the DVD-ROM 2201 or the IC card. The program is read from the computer readable media, installed into the hard disk drive 2224, RAM 2214, or ROM 2230, which are also examples of computer readable media, and executed by the CPU 2212. The information processing described in these programs is read into the computer 2200, resulting in cooperation between a program and the above-mentioned various types of hardware resources. An apparatus or method may be constituted by realizing the operation or processing of information in accordance with the usage of the computer 2200.

For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., and perform various types of processing on the data on the RAM 2214. The CPU 2212 may then write back the processed data to the external recording medium.

Various types of information, such as various types of programs, data, tables, and databases, may be stored in the recording medium to undergo information processing. The CPU 2212 may perform various types of processing on the data read from the RAM 2214, which includes various types of operations, processing of information, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored in the computer readable media on or near the computer 2200. In addition, a recording medium such as a hard disk or a RAM provided in a server system connected to a dedicated communication network or the Internet can be used as the computer readable media, thereby providing the program to the computer 2200 via the network.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An apparatus comprising:
   a voltage measuring unit configured to measure each of instantaneous voltages of three-phase AC voltage;
   a determination unit configured to determine a state of a power supply source of the three-phase AC voltage based on a result of comparison between a comparison target value corresponding to a sum of n-th powers (n is a positive even number) of the instantaneous voltages of the three-phase AC voltage and a reference value; and
   a switching unit to switch out the power supply source for an alternative power supply source regardless of the determined state in response to a frequency of the switch out exceeding a reference frequency, the switching unit being configured to switch a to-be-used power supply source between a first power supply source of the three-phase AC voltage and a second power supply source of the three-phase AC voltage based on a determination result of the determination unit of the apparatus,
   wherein the determination unit includes:
      a first determination unit configured to determine that the power supply source is in an abnormal state in response to the comparison target value intermittently falling below a first reference value for a first reference time, and
      a second determination unit configured to determine that the power supply source is in an abnormal state in response to the comparison target value falling below a second reference value smaller than the first reference value.

2. The apparatus according to claim 1, wherein the first determination unit sequentially shifts a time window having a time duration of the first reference time and determines that the power supply source is in an abnormal state in response to the comparison target value intermittently falling below the first reference value at each of a plurality of time points within the time window.

3. The apparatus according to claim 2, wherein the first determination unit, after determining that the power supply source is in a normal state, does not determine that the power supply source has become an abnormal state in a case that the time window includes a period during which the comparison target value is continuously equal to or higher than the first reference value for a second reference time that is shorter than the first reference time.

4. The apparatus according to claim 1, wherein the first determination unit determines that the power supply source is abnormal in response to the comparison target value falling below the first reference value a larger number of times than a reference number within the first reference time.

5. The apparatus according to claim 1, wherein the determination unit calculates the comparison target value at a period equal to an integral submultiple of a period of the three-phase AC voltage to perform determination.

6. The power supply according to claim 1, wherein
   the determination unit determines a state of the first power supply source, and
   the switching unit switches the to-be-used power supply source to the first power supply source in a case that the determination unit determines that the first power supply source is in a normal state and switches the to-be-used power supply source to the second power supply source in a case that the determination unit determines that the first power supply source is in an abnormal state.

7. The power supply according to claim 6, wherein the determination unit, after determining that the first power supply source is in an abnormal state, determines that the first power supply source has become a normal state in response to the comparison target value for the first power supply source being continuously equal to or higher than the first reference value for the first reference time.

8. The power supply according to claim 6, wherein the determination unit sets the first reference value to be higher for determining that the first power supply source has become a normal state from an abnormal state than for determining that the first power supply source has become an abnormal state from a normal state.

9. The power supply according to claim 1, further comprising:
   a positive side capacitor and a negative side capacitor connected in order between a positive side output terminal and a negative side output terminal;
   a positive side semiconductor switch and a negative side semiconductor switch for each phase of the three-phase AC voltage, the positive side semiconductor switch and the negative side semiconductor switch being connected in order in parallel to the positive side capacitor and the negative side capacitor between the positive side output terminal and the negative side output terminal; and
   a plurality of rectifier circuits, each including an AC input terminal and being configured to rectify current flowing between the AC input terminal and the positive side output terminal and between the AC input terminal and the negative side output terminal, wherein
   each of the plurality of rectifier circuits is provided for each phase of the three-phase AC voltage and each of the first power supply source and the second power supply source, and includes:
   a positive side rectifier connected between the AC input terminal and the positive side output terminal, capable of controlling a conduction state in a forward direction from the AC input terminal to the positive side output terminal, and configured to interrupt current in a reverse direction; and
   a negative side rectifier connected between the AC input terminal and the negative side output terminal, capable of controlling a conduction state in a forward direction from the negative side output terminal to the AC input terminal, and configured to interrupt current in a reverse direction.

10. The power supply according to claim 9, wherein the positive side rectifier and the negative side rectifier of each of the plurality of rectifier circuits are thyristors.

11. A method comprising:
measuring each of instantaneous voltages of three-phase AC voltage;
determining a state of a power supply source of the three-phase AC voltage based on a result of comparison between a comparison target value corresponding to a sum of n-th powers (n is a positive even number) of the instantaneous voltages of the three-phase AC voltage and a reference value; and
switching out the power supply source for an alternative power supply source regardless of the determined state in response to a frequency of the switching out exceeding a reference frequency, the switching out causing switching between a to-be-used power supply source between a first power supply source of the three-phase AC voltage and a second power supply source of the three-phase AC voltage based on the determined state,
wherein the determining includes:
determining that the power supply source is in an abnormal state in response to the comparison target value intermittently falling below a first reference value for a first reference time, and
determining that the power supply source is in an abnormal state in response to the comparison target value falling below a second reference value smaller than the first reference value.

12. A recording medium having recorded thereon a program that causes a computer to:
measure each of instantaneous voltages of three-phase AC voltage;
determine a state of a power supply source of the three-phase AC voltage based on a result of comparison between a comparison target value corresponding to a sum of n-th powers (n is a positive even number) of the instantaneous voltages of the three-phase AC voltage and a reference value; and
switch out the power supply source for an alternative power supply source regardless of the determined state in response to a frequency of the switch out exceeding a reference frequency, the switching out causing switching between a to-be-used power supply source between a first power supply source of the three-phase AC voltage and a second power supply source of the three-phase AC voltage based on the determined state,
wherein the determine the state of the power supply source includes:
determine that the power supply source is in an abnormal state in response to the comparison target value intermittently falling below a first reference value for a first reference time, and
determine that the power supply source is in an abnormal state in response to the comparison target value falling below a second reference value smaller than the first reference value.

* * * * *